US012580551B2

(12) United States Patent
Taniguchi et al.

(10) Patent No.: US 12,580,551 B2
(45) Date of Patent: Mar. 17, 2026

(54) MULTIPLEXER

(71) Applicant: Murata Manufacturing Co., Ltd.,
Nagaokakyo (JP)

(72) Inventors: Yasumasa Taniguchi, Nagaokakyo
(JP); Koji Nosaka, Nagaokakyo (JP);
Ryo Nakagawa, Nagaokakyo (JP)

(73) Assignee: **MURATA MANUFACTURING CO.,
LTD.**, Kyoto (JP)

( * ) Notice: Subject to any disclaimer, the term of this
patent is extended or adjusted under 35
U.S.C. 154(b) by 593 days.

(21) Appl. No.: 17/868,817

(22) Filed: Jul. 20, 2022

(65) Prior Publication Data

US 2022/0376675 A1    Nov. 24, 2022

Related U.S. Application Data

(63) Continuation of application No.
PCT/JP2021/002277, filed on Jan. 22, 2021.

(30) Foreign Application Priority Data

Jan. 31, 2020    (JP) ................................ 2020-015859

(51) Int. Cl.
H03H 9/70        (2006.01)
H03H 9/13        (2006.01)
(Continued)

(52) U.S. Cl.
CPC ................ H03H 9/70 (2013.01); H03H 9/13
(2013.01); H03H 9/205 (2013.01); **H03H
9/605** (2013.01)

(58) Field of Classification Search
CPC .......... H03H 9/701; H03H 9/13; H03H 9/205;
H03H 9/605
See application file for complete search history.

(56) References Cited

U.S. PATENT DOCUMENTS 9,602,076 B1    3/2017  Kreuzer et al.
2017/0179928 A1*  6/2017  Raihn ................... H03H 9/542
(Continued)

FOREIGN PATENT DOCUMENTS

JP        2019022164 A    2/2019
JP        2019106622 A    6/2019
(Continued)

OTHER PUBLICATIONS

International Search Report in PCT/JP2021/002277, mailed Mar.
16, 2021, 3 pages.
(Continued)

*Primary Examiner* — Samuel S Outten
(74) *Attorney, Agent, or Firm* — Keating & Bennett, LLP

(57) ABSTRACT

When a current flowing in a series circuit including an
equivalent resistance, an equivalent inductor, and an equiva-
lent capacitance in an electric equivalent circuit of a specific
resonator in each filter is defined as an acoustic path current,
under conditions that a phase of an acoustic path current of
a first transmission filter at a side of a common terminal at
a frequency within a first transmission band is represented by
$\theta 1_{Tx}$, a phase of an acoustic path current of the first trans-
mission filter at the side of the common terminal at a
frequency within a second transmission band is represented
as $\theta 2_{Tx}$, a phase of an acoustic path current of a first
reception filter at the side of the common terminal at a
frequency within the first transmission band is represented
as $\theta 1_{Rx}$, and a phase of an acoustic path current of the first
reception filter at the side of the common terminal at a
frequency within the second transmission band is repre-
sented as $\theta 2_{Rx}$, a multiplexer satisfies a first condition:
$|(2\cdot\theta 1_{Tx}-\theta 2_{Tx})-(2\cdot\theta 1_{Rx}-\theta 2_{Rx})|=180°\pm90°$, or a second con-
dition: $|(2\cdot\theta 2_{Tx}-\theta 1_{Tx})-(2\cdot\theta 2_{Rx}-\theta 1_{Rx})|=180°\pm90°$.

18 Claims, 17 Drawing Sheets

(51) Int. Cl.
　　 *H03H 9/205* 　　　(2006.01)
　　 *H03H 9/60* 　　　(2006.01)

(56) References Cited

U.S. PATENT DOCUMENTS

| | | | |
|---|---|---|---|
| 2018/0019509 A1* | 1/2018 | Yasuda | .................... H01P 5/12 |
| 2018/0152210 A1* | 5/2018 | Araki | .................... H04B 1/40 |
| 2019/0028086 A1 | 1/2019 | Takamine | |
| 2019/0181836 A1 | 6/2019 | Nakai et al. | |
| 2019/0393862 A1 | 12/2019 | Okada | |
| 2020/0204158 A1 | 6/2020 | Nosaka | |

FOREIGN PATENT DOCUMENTS

| | | |
|---|---|---|
| JP | 2019220877 A | 12/2019 |
| JP | 2020102814 A | 7/2020 |
| WO | 2018123545 A1 | 7/2018 |

OTHER PUBLICATIONS

Written Opinion in PCT/JP2021/002277, mailed Mar. 16, 2021, 5 pages.
Taniguchi et al., "Multiplexer", U.S. Appl. No. 17/868,815, filed Jul. 20, 2022.

* cited by examiner

FIG. 6

FIG. 17A                                          FIG. 17B
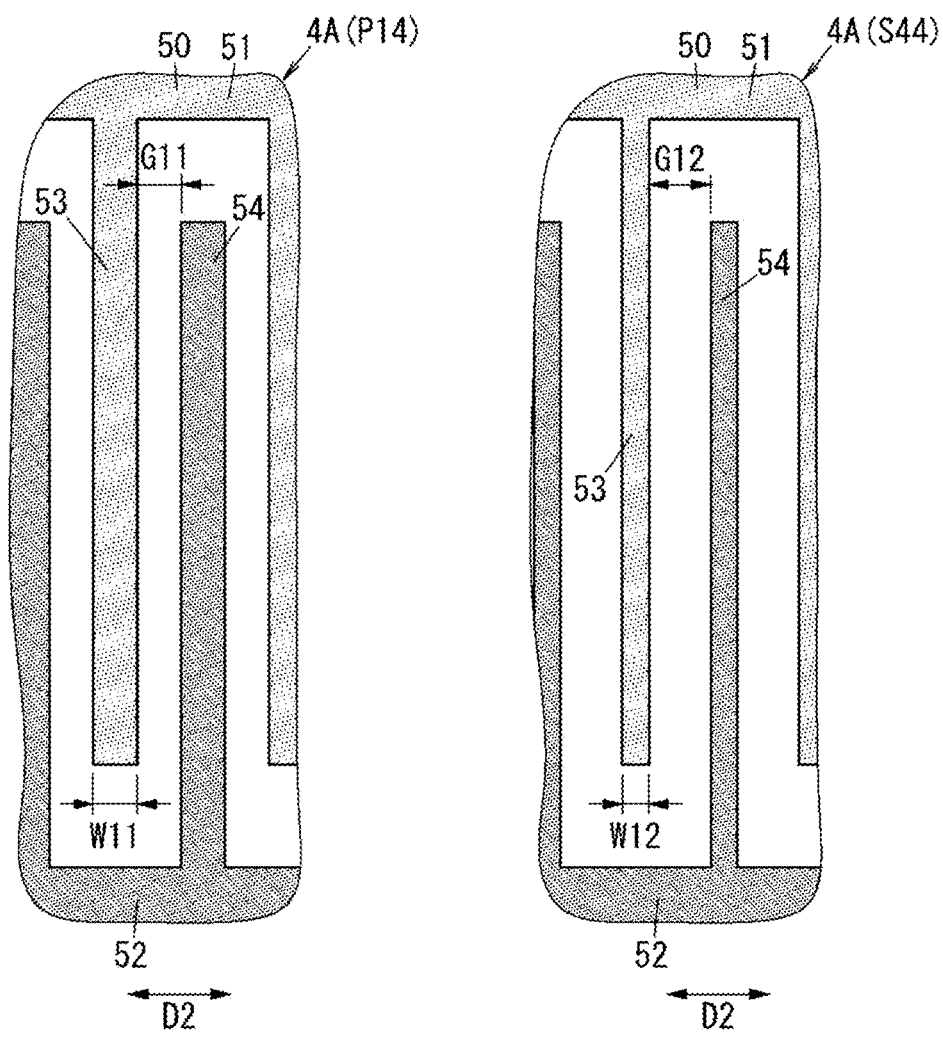
FIG. 18A                                          FIG. 18B
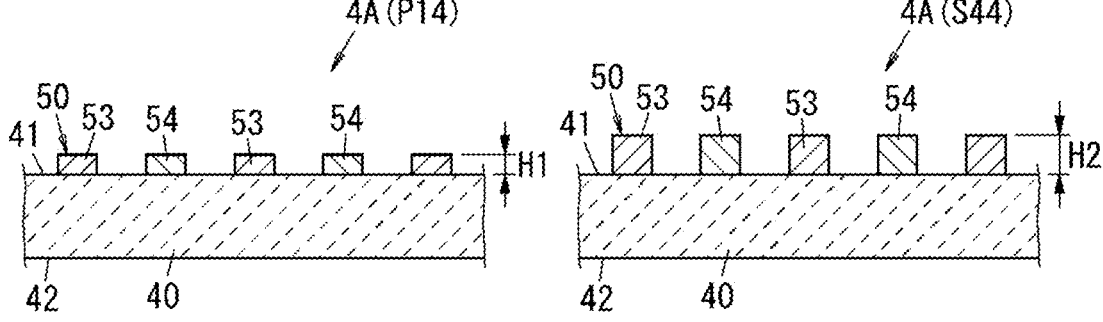

FIG. 20A                                      FIG. 20B
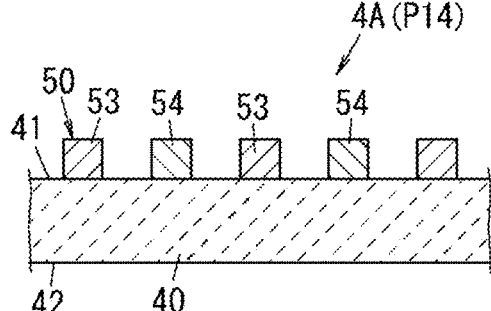
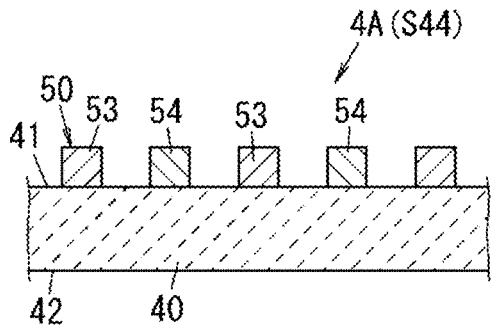

FIG. 21

MULTIPLEXER

CROSS REFERENCE TO RELATED APPLICATIONS

This application claims the benefit of priority to Japanese Patent Application No. 2020-015859 filed on Jan. 31, 2020 and is a Continuation Application of PCT Application No. PCT/JP2021/002277 filed on Jan. 22, 2021. The entire contents of each application are hereby incorporated herein by reference.

BACKGROUND OF THE INVENTION

1. Field of the Invention

The present invention relates generally to a multiplexer and, more particularly, to a multiplexer including a transmission filter and a reception filter.

2. Description of the Related Art

Conventionally, a multiplexer including transmission filters and reception filters for a plurality of bands has been known (for example, refer to International Publication No. 2018/123545).

The multiplexer described in International Publication No. 2018/123545 includes a plurality of filters (a first transmission filter, a first reception filter, a second transmission filter, and a second reception filter) for different frequency bands. The first transmission filter, the first reception filter, the second transmission filter, and the second reception filter are connected to a common terminal connected to an antenna. The first transmission filter is, for example, a transmission filter whose pass band is a transmission band (1710 MHz to 1785 MHz) of Band3 of the Long Term Evolution (LTE) standard. The first reception filter is, for example, a reception filter whose pass band is a reception band of Band3 (1805 MHz to 1880 MHz). The second transmission filter is, for example, a transmission filter whose pass band is a transmission band of Band1 (1920 MHz to 1980 MHz). The second reception filter is, for example, a reception filter whose pass band is a reception band of Band1 (2110 MHz to 2170 MHz). The center frequency of the pass band of the first reception filter is between the center frequency of the pass band of the first transmission filter and the center frequency of the pass band of the second transmission filter. Each of the plurality of filters is a ladder filter including parallel arm resonators and series arm resonators.

SUMMARY OF THE INVENTION

A communication device including the multiplexer described in International Publication No. 2018/123545 is capable of supporting carrier aggregation (two-uplink carrier aggregation) that simultaneously uses two frequency bands in uplink. However, in the communication device, when two-uplink carrier aggregation in which two signals in different frequency bands are simultaneously transmitted by using the multiplexer described in International Publication No. 2018/123545 is performed, there is a concern that intermodulation distortion (IMD) occurs and the reception sensitivity of a reception filter deteriorates.

Preferred embodiments of the present invention provide multiplexers each capable of suppressing the occurrence of IMD.

A multiplexer according to an aspect of a preferred embodiment of the present invention includes a common terminal and a plurality of filters. The plurality of filters are connected to the common terminal. Each of the plurality of filters includes a plurality of resonators. The plurality of filters include a first transmission filter, a second transmission filter, and a first reception filter. The first transmission filter has a pass band including a first transmission band. The second transmission filter has a pass band including a second transmission band different from the first transmission band. The first reception filter has a pass band including a first reception band. A center frequency of the first reception band is between a center frequency of the first transmission band and a center frequency of the second transmission band. In the multiplexer, in a case where an electric equivalent circuit of a specific resonator among the plurality of resonators in each of the plurality of filters is represented by using a parallel circuit including a series circuit of an equivalent resistance, an equivalent inductor, and an equivalent capacitance, and a damping capacitance, and a current flowing in the series circuit is defined as an acoustic path current, under conditions that a phase of an acoustic path current of the first transmission filter at a side of the common terminal at a frequency within the first transmission band is represented as $\theta1_{Tx}$, a phase of an acoustic path current of the first transmission filter at the side of the common terminal at a frequency within the second transmission band is represented as $\theta2_{Tx}$, a phase of an acoustic path current of the first reception filter at the side of the common terminal at a frequency within the first transmission band is represented as $\theta1_{Rx}$, and a phase of an acoustic path current of the first reception filter at the side of the common terminal at a frequency within the second transmission band is represented as $\theta2_{Rx}$, the multiplexer satisfies a first condition or a second condition. The first condition is a condition that $|(2 \cdot \theta1_{Tx} - \theta2_{Tx}) - (2 \cdot \theta1_{Rx} - \theta2_{Rx})| = 180° \pm 90°$. The second condition is a condition that $|(2 \cdot \theta2_{Tx} - \theta1_{Tx}) - (2 \cdot \theta2_{Rx} - \theta1_{Rx})| = 180° \pm 90°$.

A multiplexer according to an aspect of a preferred embodiment of the present invention includes a common terminal and a plurality of filters. The plurality of filters are connected to the common terminal. Each of the plurality of filters includes a plurality of resonators. The plurality of filters include a first transmission filter, a second transmission filter, and a first reception filter. The first transmission filter has a pass band including a first transmission band. The second transmission filter has a pass band including a second transmission band different from the first transmission band. The first reception filter has a pass band including a first reception band. A center frequency of the first reception band is between a center frequency of the first transmission band and a center frequency of the second transmission band. In each of the plurality of filters, a resonator closest to the common terminal among the plurality of resonators is defined as a specific resonator. Each of the first transmission filter, the second transmission filter, and the first reception filter is a ladder filter and includes a plurality of series arm resonators and a plurality of parallel arm resonators as the plurality of resonators. Regarding one of the first transmission filter and the second transmission filter, and the first reception filter, in a filter having a center frequency of a relatively high pass band, the specific resonator is one parallel arm resonator among the plurality of parallel arm resonators, and in a filter having a center frequency of a relatively low pass band, the specific resonator is one series arm resonator among the plurality of series arm resonators. In the multiplexer, a capacitance of a damping capacitance of the specific resonator of one of the first transmission filter and the second transmission filter is larger than a capacitance of a damping capacitance of the specific resonator of the first reception filter. Alternatively, in the multiplexer, an area of the specific resonator of one of the first transmission filter and the second transmission filter is larger than an area of the specific resonator of the first reception filter. Alternatively, in the multiplexer, the number of a plurality of division resonators included in the specific resonator of one of the first transmission filter and the second transmission filter, the plurality of division resonators being connected in series, is larger than the number of a plurality of division resonators included in the specific resonator of the first reception filter, the plurality of division resonators being connected in series. Alternatively, in the multiplexer, each of the plurality of resonators of the first transmission filter includes an IDT electrode, each of the plurality of resonators of the first reception filter includes an IDT electrode, and a duty of the IDT electrode of the specific resonator of the first transmission filter is different from a duty of the IDT electrode of the specific resonator of the first reception filter. Alternatively, in the multiplexer, each of the plurality of resonators of the first transmission filter includes an IDT electrode, each of the plurality of resonators of the first reception filter includes an IDT electrode, and a thickness of the IDT electrode in the specific resonator of the first transmission filter is smaller than a thickness of the IDT electrode in the specific resonator of the first reception filter. Alternatively, in the multiplexer, each of the plurality of resonators of the first transmission filter includes an IDT electrode, each of the plurality of resonators of the first reception filter includes an IDT electrode, the IDT electrode of the specific resonator of the first transmission filter is a polycrystalline metal electrode, and the IDT electrode of the specific resonator of the first reception filter is an epitaxial layer electrode made of metal. Alternatively, in the multiplexer, each of the plurality of resonators of the first transmission filter includes an IDT electrode, each of the plurality of resonators of the first reception filter includes an IDT electrode, the IDT electrode of the specific resonator of the first transmission filter includes one or more materials selected from Pt, Mo, Au, Ag, Cu, and W, and a content rate of the one or more materials selected from Pt, Mo, Au, Ag, Cu, and W in the IDT electrode of the specific resonator of the first transmission filter is higher than a content rate of the one or more materials in the IDT electrode of the specific resonator of the first reception filter.

The multiplexers according to each of the above-described aspects of preferred embodiments of the present invention suppress the occurrence of IMD.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 6 is an equivalent circuit diagram of the multiplexer described above.

FIG. 17A is a plan view of a specific resonator of a first transmission filter in a multiplexer according to Modification 3 of Preferred Embodiment 1 of the present invention.

FIG. 17B is a plan view of a specific resonator of a first reception filter in the multiplexer described above.

FIG. 18A is a cross-sectional view of a specific resonator of a first transmission filter in a multiplexer according to Preferred Embodiment 2 of the present invention. FIG. 18B is a cross-sectional view of a specific resonator of a first reception filter in the multiplexer described above.

FIG. 20A is a cross-sectional view of a specific resonator of a first transmission filter in a multiplexer according to Preferred Embodiment 4 of the present invention. FIG. 20B is a cross-sectional view of a specific resonator of a first reception filter in the multiplexer described above.

Figure 21:
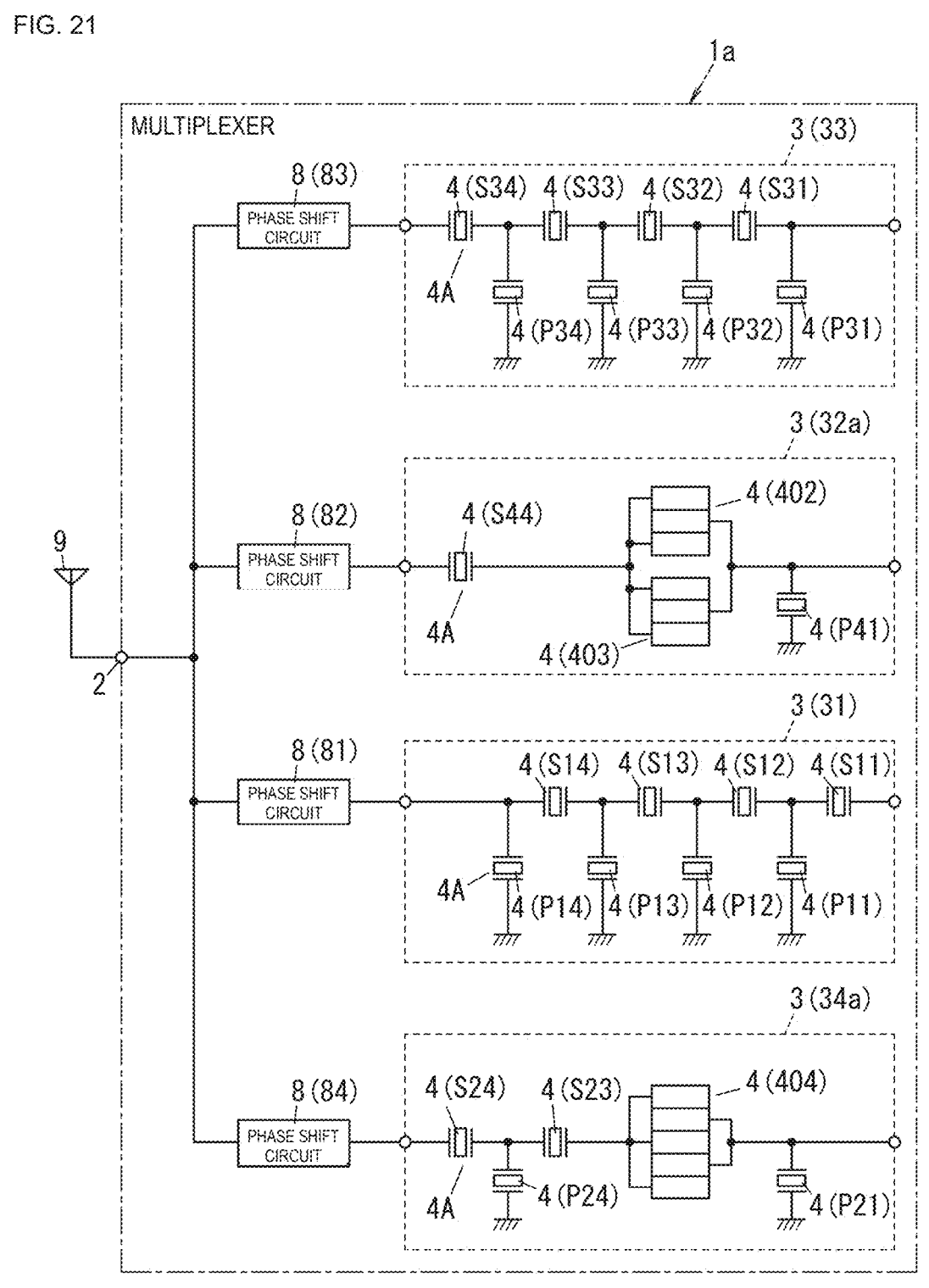
Figure 1:
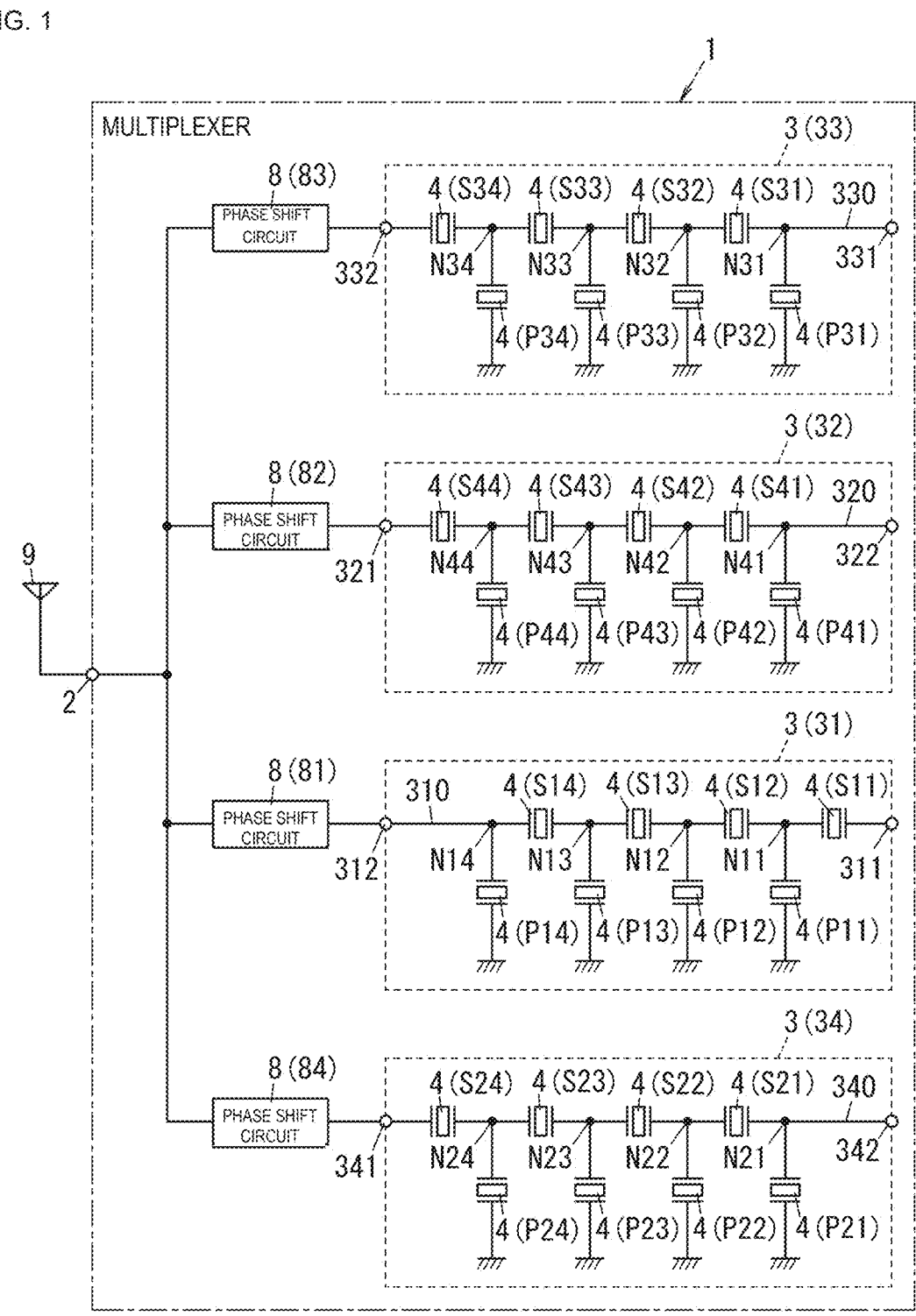
FIG. 1 is a circuit diagram of a multiplexer according to Preferred Embodiment 1 of the present invention.

FIG. 21 is a circuit diagram of a multiplexer according to Preferred Embodiment 5 of the present invention.

DETAILED DESCRIPTION OF THE PREFERRED EMBODIMENTS

Preferred Embodiment 1

Hereinafter, a multiplexer 1 according to Preferred Embodiment 1 will be described with reference to FIGS. 1 to 13B.

(1.1) Basic Configuration of Multiplexer

The multiplexer 1 according to Preferred Embodiment 1 is used for, for example, a mobile phone supporting carrier aggregation (for example, a smartphone), a wearable terminal (for example, a smartwatch), or the like.

The multiplexer 1 includes a common terminal 2 and a plurality of filters 3. Additionally, the multiplexer 1 further includes a plurality of phase shift circuits 8 corresponding one-to-one to the plurality of filters 3.

The plurality of filters 3 include a first transmission filter 31, a second transmission filter 33, and a first reception filter 32. Additionally, the plurality of filters 3 further include a second reception filter 34.

The plurality of filters 3 are connected to the common terminal 2. The common terminal 2 is connected to an antenna 9. The plurality of filters 3 are connected to the common terminal 2 with the corresponding phase shift circuit 8 in the one-to-one manner among the plurality of phase shift circuits 8 interposed therebetween. The plurality of phase shift circuits 8 include a first phase shift circuit 81, a second phase shift circuit 82, a third phase shift circuit 83, and a fourth phase shift circuit 84. The first phase shift circuit 81 is connected between the common terminal 2 and the first transmission filter 31. The second phase shift circuit 82 is connected between the common terminal 2 and the first reception filter 32. The third phase shift circuit 83 is connected between the common terminal 2 and the second transmission filter 33. The fourth phase shift circuit 84 is connected between the common terminal 2 and the second reception filter 34. Each of the plurality of filters 3 includes a plurality of resonators 4.

The first transmission filter 31 includes an input terminal 311 and an output terminal 312. In the first transmission filter 31, the output terminal 312 is connected to the common terminal 2. The second transmission filter 33 includes an input terminal 331 and an output terminal 332. In the second transmission filter 33, the output terminal 332 is connected to the common terminal 2. The first reception filter 32 includes an input terminal 321 and an output terminal 322. In the first reception filter 32, the input terminal 321 is connected to the common terminal 2. The second reception filter 34 includes an input terminal 341 and an output terminal 342. In the second reception filter 34, the input terminal 341 is connected to the common terminal 2.

The first transmission filter 31 is a band pass filter having a first transmission band as a pass band. The second transmission filter 33 is a band pass filter having a second transmission band different from the first transmission band as a pass band. The first reception filter 32 is a band pass filter having a first reception band as a pass band. The second reception filter 34 is a band pass filter having a second reception band as a pass band. A center frequency of the first reception band is between a center frequency of the first transmission band and a center frequency of the second transmission band. The first transmission band is, for example, an uplink frequency band (1920 MHz to 1980 MHz) in Band1 of the Third Generation Partnership Project (3GPP) Long Term Evolution (LTE) standard. The second transmission band is, for example, an uplink frequency band (1710 MHz to 1785 MHz) in Band3 of the 3GPP LTE standard. The first reception band is, for example, a downlink frequency band (1805 MHz to 1880 MHz) in Band3 of the 3GPP LTE standard. The second reception band is, for example, a downlink frequency band (2110 MHz to 2170 MHz) in Band1 of the 3GPP LTE standard. A center frequency of the first reception band is between a center frequency of the first transmission band and a center frequency of the second transmission band. Note that the first transmission filter 31 is a band pass filter having the first transmission band as a pass band, but is not limited thereto, and is only required to be a band pass filter having a pass band including the first transmission band. In addition, the second transmission filter 33 is a band pass filter having the second transmission band as a pass band, but is not limited thereto, and is only required to be a band pass filter having a pass band including the second transmission band. In addition, the first reception filter 32 is a band pass filter having the first reception band as a pass band, but is not limited thereto, and is only required to be a band pass filter having a pass band including the first reception band. In addition, the second reception filter 34 is a band pass filter having the second reception band as a pass band, but is not limited thereto, and is only required to be a band pass filter having a pass band including the second reception band.

The pass bands of the plurality of filters 3 do not overlap each other. Thus, the pass band of the first transmission filter 31 does not overlap the respective pass bands of the second transmission filter 33, the first reception filter 32, and the second reception filter 34. Further, the pass band of the second transmission filter 33 does not overlap the respective pass bands of the first transmission filter 31, the first reception filter 32, and the second reception filter 34. Further, the pass band of the first reception filter 32 does not overlap the respective pass bands of the first transmission filter 31, the second transmission filter 33, and the second reception filter 34. Further, the pass band of the second reception filter 34 does not overlap the respective pass bands of the first transmission filter 31, the second transmission filter 33, and the first reception filter 32.

For example, the multiplexer 1 can simultaneously transmit, from the common terminal 2, a transmission signal in the pass band of the first transmission filter 31 input to the input terminal 311 of the first transmission filter 31 and a transmission signal in the pass band of the second transmission filter 33 input to the input terminal 331 of the second transmission filter 33. That is, the multiplexer 1 can support two-uplink carrier aggregation.

The first transmission filter 31 is, for example, a ladder filter, and includes a plurality of (for example, four) series arm resonators S11 to S14 and a plurality of (for example, four) parallel arm resonators P11 to P14 as the plurality of (for example, eight) resonators 4.

The plurality of series arm resonators S11 to S14 are provided on a path 310 (hereinafter also referred to as a series arm path 310) between the input terminal 311 and the output terminal 312. The plurality of series arm resonators S11 to S14 are connected in series on the series arm path 310. In the first transmission filter 31, the plurality of series arm resonators S11 to S14 are arranged in the order of the series arm resonator S11, the series arm resonator S12, the series arm resonator S13, and the series arm resonator S14 from the input terminal 311 side.

The parallel arm resonator P11 is provided between a node N11 on the series arm path 310 and a ground (ground terminal). The node N11 is positioned between the series arm resonator S11 and the series arm resonator S12 on the series arm path 310. The parallel arm resonator P12 is provided between a node N12 on the series arm path 310 and the ground. The node N12 is positioned between the series arm resonator S12 and the series arm resonator S13 on the series arm path 310. The parallel arm resonator P13 is provided between a node N13 on the series arm path 310 and the ground. The node N13 is positioned between the series arm resonator S13 and the series arm resonator S14 on the series arm path 310. The parallel arm resonator P14 is provided between a node N14 on the series arm path 310 and the ground. The node N14 is positioned between the series arm resonator S14 and the output terminal 312 on the series arm path 310. In other words, in the first transmission filter 31, two parallel arm resonators P14 and P13 and one series arm resonator S14 define a n-type filter at the output terminal 312 side. Thus, in the multiplexer 1, the resonator 4 is not connected between the common terminal 2 and the parallel arm resonator P14 of the first transmission filter 31.

The second transmission filter 33 is, for example, a ladder filter, and includes a plurality of (for example, four) series arm resonators S31 to S34 and a plurality of (for example, four) parallel arm resonators P31 to P34 as the plurality of (for example, eight) resonators 4.

The plurality of series arm resonators S31 to S34 are provided on a path 330 (hereinafter also referred to as a series arm path 330) between the input terminal 331 and the output terminal 332. The plurality of series arm resonators S31 to S34 are connected in series on the series arm path 330. In the second transmission filter 33, the plurality of series arm resonators S31 to S34 are arranged in the order of the series arm resonator S31, the series arm resonator S32, the series arm resonator S33, and the series arm resonator S34 from the input terminal 331 side.

The parallel arm resonator P31 is provided between a node N31 on the series arm path 330 and the ground (ground terminal). The node N31 is positioned between the input terminal 331 and the series arm resonator S31 on the series arm path 330. The parallel arm resonator P32 is provided between a node N32 on the series arm path 330 and the ground. The node N32 is positioned between the series arm resonator S31 and the series arm resonator S32 on the series arm path 330. The parallel arm resonator P33 is provided between a node N33 on the series arm path 330 and the ground. The node N33 is positioned between the series arm resonator S32 and the series arm resonator S33 on the series arm path 330. The parallel arm resonator P34 is provided between a node N34 on the series arm path 330 and the ground. The node N34 is positioned between the series arm resonator S33 and the series arm resonator S34 on the series arm path 330. In other words, in the second transmission filter 33, two series arm resonators S34 and S33, and one parallel arm resonator P34 define a T-type filter at the output terminal 332 side.

The first reception filter 32 is, for example, a ladder filter, and includes a plurality of (for example, four) series arm resonators S41 to S44 and a plurality of (for example, four) parallel arm resonators P41 to P44 as the plurality of (for example, eight) resonators 4.

The plurality of series arm resonators S41 to S44 are provided on a path 320 (hereinafter also referred to as a series arm path 320) between the input terminal 321 and the output terminal 322. The plurality of series arm resonators S41 to S44 are connected in series on the series arm path 320. In the first reception filter 32, the plurality of series arm resonators S41 to S44 are arranged in the order of the series arm resonator S41, the series arm resonator S42, the series arm resonator S43, and the series arm resonator S44 from the output terminal 322 side.

The parallel arm resonator P41 is provided between a node N41 on the series arm path 320 and the ground (ground terminal). The node N41 is positioned between the output terminal 322 and the series arm resonator S41 on the series arm path 320. The parallel arm resonator P42 is provided between a node N42 on the series arm path 320 and the ground. The node N42 is positioned between the series arm resonator S41 and the series arm resonator S42 on the series arm path 320. The parallel arm resonator P43 is provided between a node N43 on the series arm path 320 and the ground. The node N43 is positioned between the series arm resonator S42 and the series arm resonator S43 on the series arm path 320. The parallel arm resonator P44 is provided between a node N44 on the series arm path 320 and the ground. The node N44 is positioned between the series arm resonator S43 and the series arm resonator S44 on the series arm path 320. In other words, in the first reception filter 32, two series arm resonators S44 and S43 and one parallel arm resonator P44 define a T-type filter at the input terminal 321 side.

The second reception filter 34 is, for example, a ladder filter and includes, as the plurality of (for example, eight) resonators 4, a plurality of (for example, four) series arm resonators S21 to S24 and a plurality of (for example, four) parallel arm resonators P21 to P24.

The plurality of series arm resonators S21 to S24 are provided on a path 340 (hereinafter also referred to as a series arm path 340) between the input terminal 341 and the output terminal 342. The plurality of series arm resonators S21 to S24 are connected in series on the series arm path 340. In the second reception filter 34, the plurality of series arm resonators S21 to S24 are arranged in the order of the series arm resonator S21, the series arm resonator S22, the series arm resonator S23, and the series arm resonator S24 from the output terminal 342 side.

The parallel arm resonator P21 is provided between a node N21 on the series arm path 340 and the ground (ground terminal). The node N21 is positioned between the output terminal 342 and the series arm resonator S21 on the series arm path 340. The parallel arm resonator P22 is provided between a node N22 on the series arm path 340 and the ground. The node N22 is positioned between the series arm resonator S21 and the series arm resonator S22 on the series arm path 340. The parallel arm resonator P23 is provided between a node N23 on the series arm path 340 and the ground. The node N23 is positioned between the series arm resonator S22 and the series arm resonator S23 on the series arm path 340. The parallel arm resonator P24 is provided between a node N24 on the series arm path 340 and the ground. The node N24 is positioned between the series arm resonator S23 and the series arm resonator S24 on the series arm path 340. In other words, in the second reception filter 34, two series arm resonators S24 and S23 and one parallel arm resonator P24 define a T-type filter at the input terminal 341 side.

Figure 2:
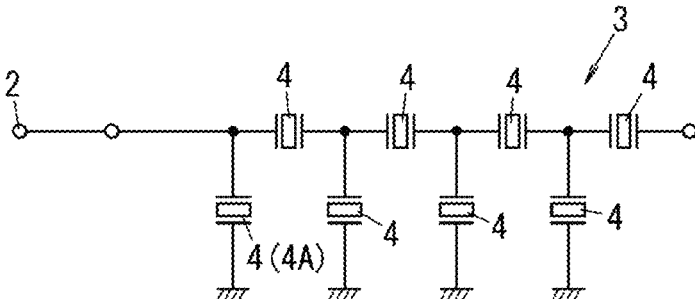
FIG. 2 is a circuit diagram of a filter in the multiplexer described above.
Figure 3:
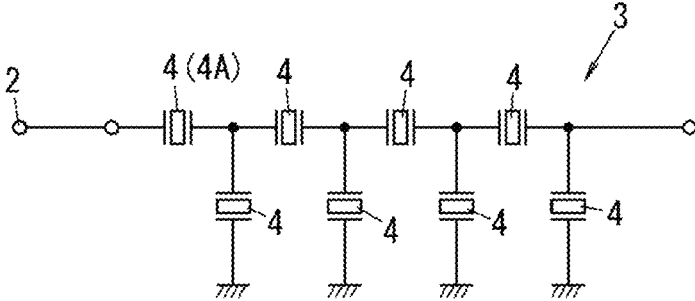
FIG. 3 is a circuit diagram of a filter in the multiplexer described above.

In each of the plurality of filters 3, one resonator 4 of the plurality of resonators 4 that is closest to the common terminal 2 is defined as a specific resonator 4A. When the filter 3 is a ladder filter in which a n-type filter is provided at the common terminal 2 side as illustrated in FIG. 2, the specific resonator 4A is the parallel arm resonator closest to the common terminal 2. Additionally, when the filter 3 is a ladder filter in which a T-type filter is provided at the common terminal 2 side as illustrated in FIG. 3, the specific resonator 4A is the series arm resonator closest to the common terminal 2.

(1.2) Structure of Filter

Each of the plurality of filters 3 is, for example, an acoustic wave filter, and each of the plurality of resonators 4 includes an acoustic wave resonator. The acoustic wave filter is, for example, a surface acoustic wave (SAW) filter using a surface acoustic wave. In this case, each of the plurality of resonators 4 is a SAW resonator.

Figure 4A:
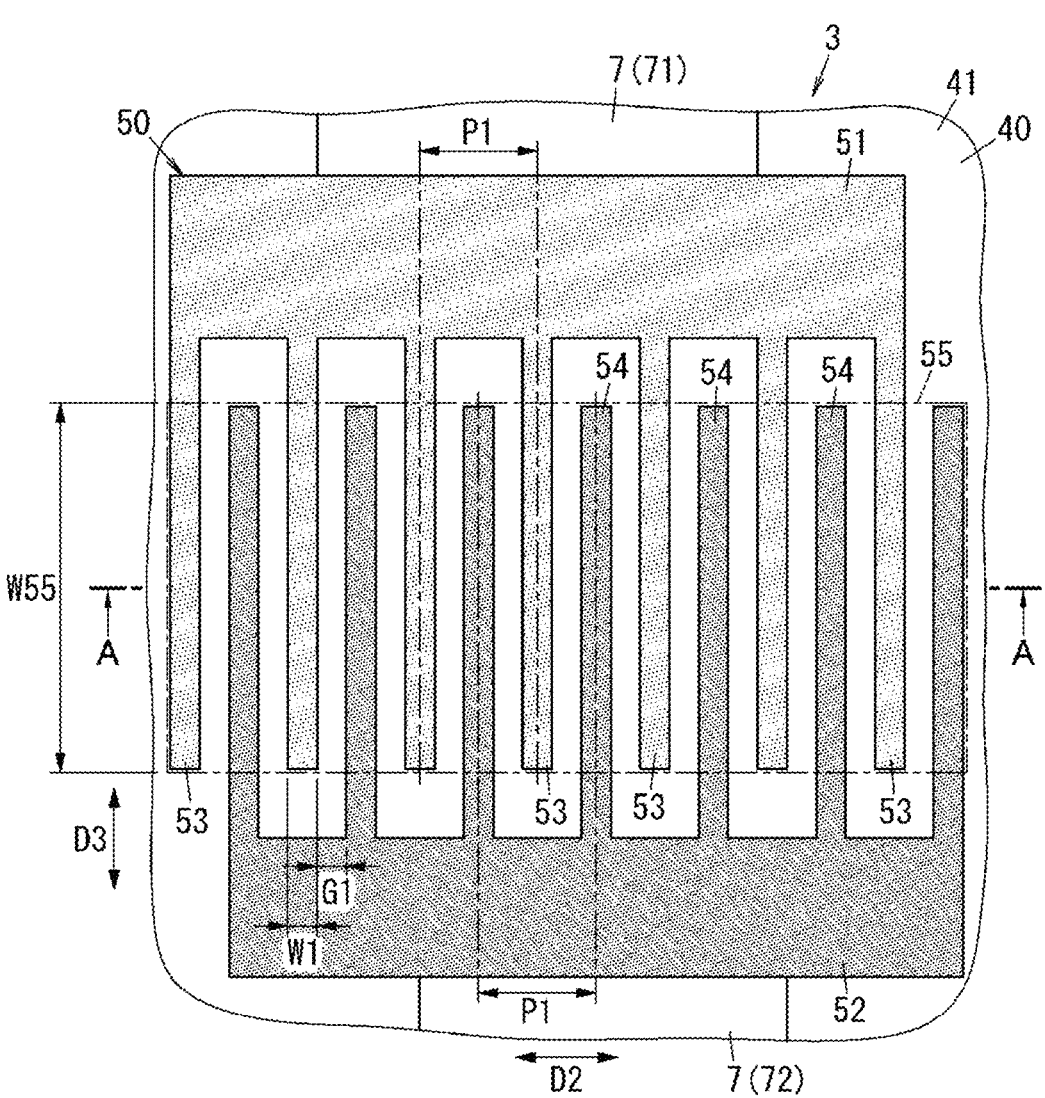
FIG. 4A is a plan view of a resonator of the filter in the multiplexer described above.
Figure 4B:
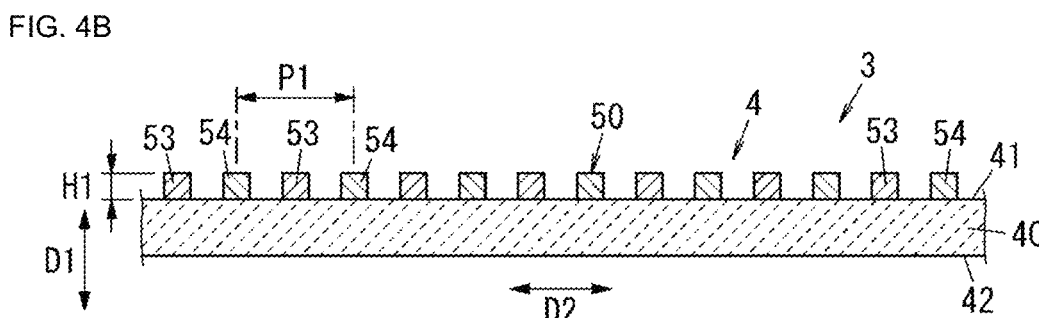
FIG. 4B is a cross-sectional view taken along a line A-A in FIG. 4A.

An example of a structure of the filter 3 will be described below with reference to FIGS. 4A and 4B.

The filter 3 includes a piezoelectric substrate 40 and a plurality of interdigital transducer (IDT) electrodes 50 provided on the piezoelectric substrate 40. Note that in FIGS. 4A and 4B, only one IDT electrode 50 among the plurality of IDT electrodes 50 is illustrated. The plurality of IDT electrodes 50 correspond one-to-one to the plurality of resonators 4. Each of the plurality of IDT electrodes 50 is an element of the corresponding resonator 4 among the plurality of resonators 4. The filter 3 is, for example, a one-chip acoustic wave filter, and each of the plurality of series arm resonators and the plurality of parallel arm resonators includes an acoustic wave resonator.

The piezoelectric substrate 40 is, for example, a piezoelectric substrate. A material of the piezoelectric substrate is, for example, lithium tantalate (LiTaO$_3$). The piezoelectric substrate is formed of, for example, a $\Gamma°$ Y-cut X-propagation LiTaO$_3$ piezoelectric single crystal. When the three crystal axes of the LiTaO$_3$ piezoelectric single crystal are defined as the X-axis, the Y-axis, and the Z-axis, the $\Gamma°$ Y-cut X-propagation LiTaO$_3$ piezoelectric single crystal is a LiTaO$_3$ piezoelectric single crystal cut along a plane having, as a normal line, an axis rotated by $\Gamma°$ in the Z-axis direction from the Y-axis with the X-axis serving as the center axis, and is a single crystal where a surface acoustic wave propagates in the X-axis direction. A cut angle of the piezoelectric substrate is $\theta=\Gamma+90°$, when it is assumed that the cut angle is $\Gamma[°]$ and Euler angles of the piezoelectric substrate are $(\varphi, \theta, \psi)$. Note that F is synonymous with $\Gamma\pm180\times n$. Here, n is a natural number. The piezoelectric substrate is not limited to the $\Gamma°$ Y-cut X-propagation LiTaO$_3$ piezoelectric single crystal, and may be, for example, $\Gamma°$ Y-cut X-propagation LiTaO$_3$ piezoelectric ceramics.

The piezoelectric substrate 40 has a first principal surface 41 and a second principal surface 42 that face each other. The first principal surface 41 and the second principal surface 42 face each other in the thickness direction of the piezoelectric substrate 40. In a plan view from the thickness direction of the piezoelectric substrate 40, the piezoelectric substrate 40 has a rectangular shape, but is not limited thereto, and may have, for example, a square shape.

The material of the piezoelectric substrate is not limited to lithium tantalate (LiTaO$_3$), and may be, for example, lithium niobate (LiNbO$_3$), zinc oxide (ZnO), aluminum nitride (AlN), or lead zirconate titanate (PZT). Note that the single crystal material and the cut angle of the piezoelectric substrate may be appropriately determined in accordance with, for example, required specifications of the filter (filter characteristics such as a bandpass characteristic, an attenuation characteristic, a temperature characteristic, and a band width) and the like.

The IDT electrodes 50 are provided on the piezoelectric substrate 40. More specifically, the IDT electrodes 50 are provided on the first principal surface 41 of the piezoelectric substrate 40.

The IDT electrode 50 includes a first busbar 51, a second busbar 52, a plurality of first electrode fingers 53, and a plurality of second electrode fingers 54. The second busbar 52 faces the first busbar 51.

The plurality of first electrode fingers 53 are connected to the first busbar 51 and extend to the second busbar 52 side. The plurality of first electrode fingers 53 are formed integrally with the first busbar 51 and are separated from the second busbar 52. A gap exists between each of the plurality of first electrode fingers 53 and the second busbar 52 in a plan view from the thickness direction of the piezoelectric substrate 40. For example, lengths of the plurality of first electrode fingers 53 are the same as each other. Further, widths of the plurality of first electrode fingers 53 are the same as each other.

The plurality of second electrode fingers 54 are connected to the second busbar 52 and extend toward the first busbar 51 side. The plurality of second electrode fingers 54 are formed integrally with the second busbar 52 and are separated from the first busbar 51. A gap exists between each of the plurality of second electrode fingers 54 and the first busbar 51 in a plan view from the thickness direction of the piezoelectric substrate 40. For example, lengths of the plurality of second electrode fingers 54 are the same as each other. Additionally, the widths of the plurality of second electrode fingers 54 are the same as each other. In the example of FIG. 4A, the lengths of the plurality of second electrode fingers 54 are the same as the lengths of the plurality of first electrode fingers 53. In addition, in the example of FIG. 4A, the widths of the plurality of second electrode fingers 54 are the same as the widths of the plurality of first electrode fingers 53.

The first busbar 51 and the second busbar 52 of the IDT electrode 50 have an elongated shape whose longitudinal direction is a second direction D2 orthogonal to a first direction D1 along the thickness direction of the piezoelectric substrate 40. In other words, the first busbar 51 and the second busbar 52 of the IDT electrode 50 have an elongated shape whose longitudinal direction is the second direction D2 that is an acoustic wave propagation direction. In the IDT electrode 50, the first busbar 51 and the second busbar 52 face each other in a third direction D3 orthogonal to both the first direction D1 and the second direction D2.

In the IDT electrode 50, the plurality of first electrode fingers 53 and the plurality of second electrode fingers 54 are arranged to be separated from each other in the second direction D2. Here, the plurality of first electrode fingers 53 and the plurality of second electrode fingers 54 are alternately arranged one by one in the second direction D2 so as to be separated from each other, but are not limited thereto. The adjacent first electrode finger 53 and second electrode finger 54 are separated from each other. A group of electrode fingers including the plurality of first electrode fingers 53 and the plurality of second electrode fingers 54 may have any configuration as long as the plurality of first electrode fingers 53 and the plurality of second electrode fingers 54 are arranged so as to be separated from each other in the second direction D2, and may have a configuration in which the plurality of first electrode fingers 53 and the plurality of second electrode fingers 54 are not alternately arranged and separated from each other. For example, a region in which the first electrode fingers 53 and the second electrode fingers 54 are arranged one by one so as to be separated from each other and a region in which two first electrode fingers 53 or two second electrode fingers 54 are arranged side by side in the second direction D2 may be mixed. The first busbar 51 is a conductor to cause the plurality of first electrode fingers 53 to have the same potential (equipotential). The second busbar 52 is a conductor to cause the plurality of second electrode fingers 54 to have the same potential (equipotential).

The IDT electrode 50 includes an intersection region 55 defined by the plurality of first electrode fingers 53 and the plurality of second electrode fingers 54. The intersection region 55 is a region between the envelope of the tips of the plurality of first electrode fingers 53 and the envelope of the tips of the plurality of second electrode fingers 54. The IDT electrode 50 excites an acoustic wave in the intersection region 55.

An electrode finger pitch P1 of the IDT electrode 50 is defined by, for example, a distance between the center lines of two adjacent first electrode fingers 53 among the plurality of first electrode fingers 53 or a distance between the center lines of two adjacent second electrode fingers 54 among the plurality of second electrode fingers 54. The distance between the center lines of two adjacent second electrode fingers 54 is the same as the distance between the center lines of two adjacent first electrode fingers 53. Additionally, as illustrated in FIG. 4A, when a width of the first electrode finger 53 in the second direction D2 is represented by W1, and an interval between the first electrode finger 53 and the second electrode finger 54 that are adjacent to each other in the second direction D2 is represented by G1, a duty of the IDT electrode 50 is defined by W1/(W1+G1). Additionally, a thickness H1 of the IDT electrode 50 is defined by, for example, the thicknesses of the plurality of first electrode fingers 53 and the plurality of second electrode fingers 54.

In the IDT electrode 50, the number of pairs of the first electrode fingers 53 and the second electrode fingers 54 is, for example, 100. That is, the IDT electrode 50 includes, for example, 100 first electrode fingers 53 and 100 second electrode fingers 54. In FIGS. 4A and 4B, the numbers of the first electrode fingers 53 and the second electrode fingers 54 are reduced in order to make the drawings be easily seen.

The IDT electrode 50 is a normal type IDT electrode, but is not limited thereto. For example, the IDT electrode 50 may be an IDT electrode subjected to apodization weighing, or may be an inclined IDT electrode. In the IDT electrode subjected to apodization weighing, an intersecting width increases closer to the center from one end portion in the propagation direction of an acoustic wave, and the intersecting width decreases closer to the other end portion from the center in the propagation direction of the acoustic wave.

The filter 3 includes a plurality of wiring portions 7. The plurality of wiring portions 7 include a first wiring portion 71 connected to the first busbar 51 of the IDT electrode 50 and a second wiring portion 72 connected to the second busbar 52 of the IDT electrode 50.

The first wiring portion 71 extends from the first busbar 51 toward the side opposite to a side of the plurality of first electrode fingers 53. The second wiring portion 72 extends from the second busbar 52 toward the side opposite to a side of the plurality of second electrode fingers 54.

(1.3) Electric Equivalent Circuit of Specific Resonator

Figure 5:
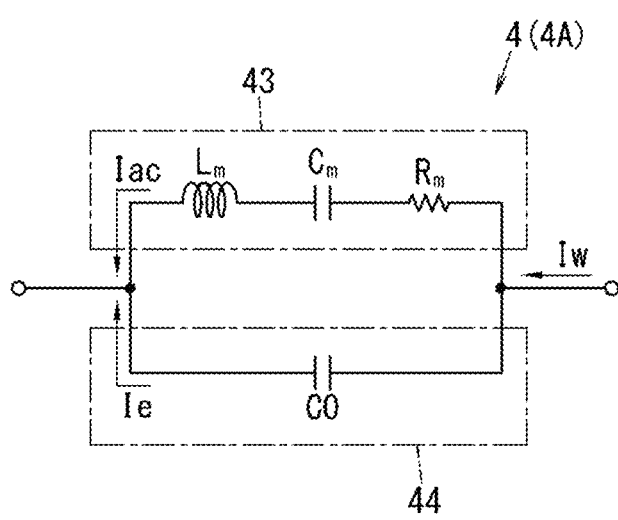
FIG. 5 is an equivalent circuit diagram of the resonator of the filter in the multiplexer described above.
Figure 6:
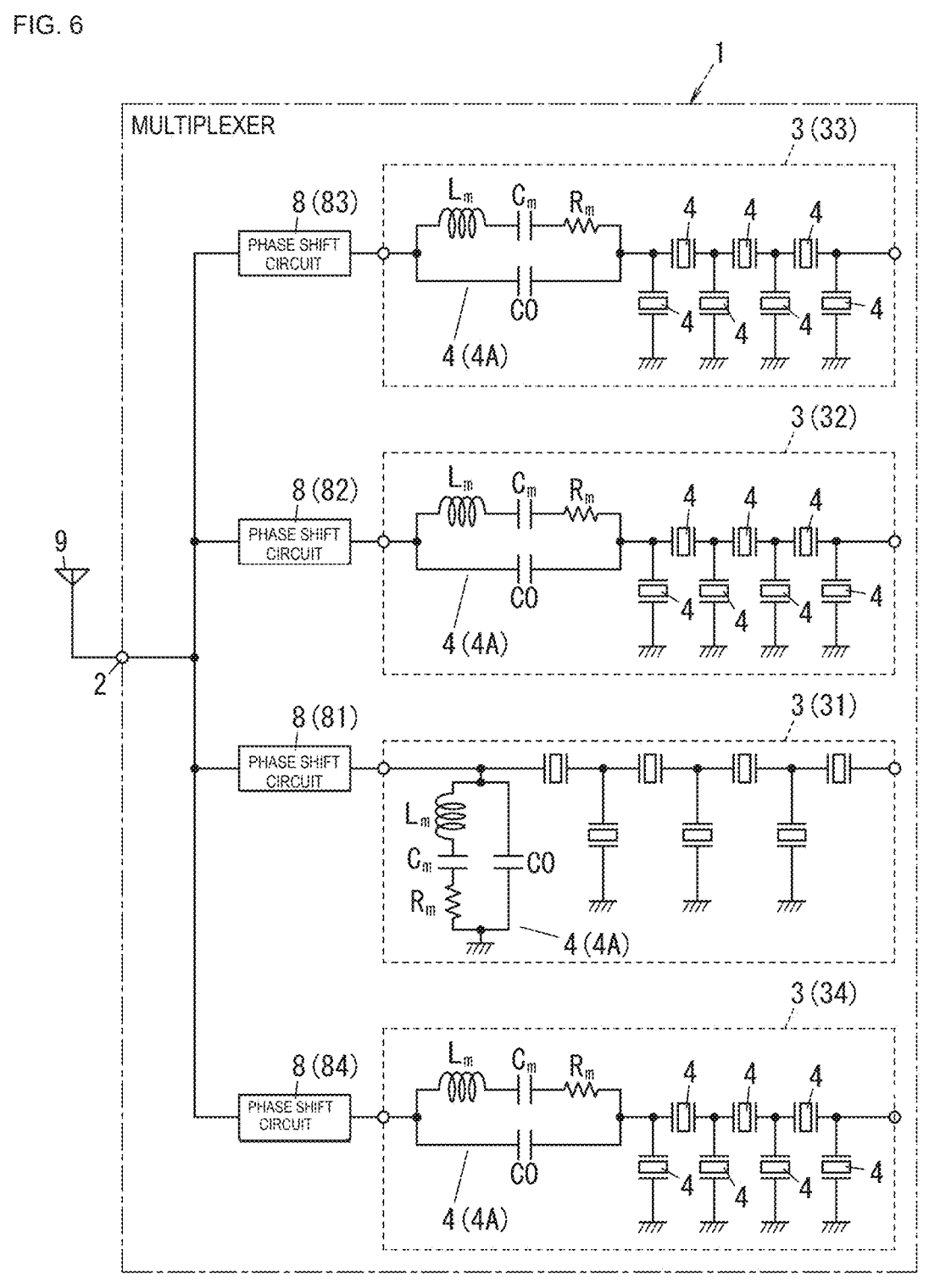

As illustrated in FIGS. 5 and 6, an electric equivalent circuit of the specific resonator 4A among the plurality of resonators 4 in each of the plurality of filters 3 can be represented by a parallel circuit of a damping capacitance C0 and a series circuit of an equivalent resistance $R_m$, an equivalent inductor $L_m$, and an equivalent capacitance $C_m$.

FIG. 5 is an electric equivalent circuit diagram of an mBVD model corresponding to the specific resonator 4A. In FIG. 5, when an AC power supply is connected between both ends of the electric equivalent circuit of the specific resonator 4A, a current input from the AC power supply to the specific resonator 4A is defined as Iw, a current flowing in the series circuit of the equivalent resistance $R_m$, the equivalent inductor $L_m$, and the equivalent capacitance $C_m$ is defined as Iac, and a current flowing through the damping capacitance C0 is defined as Ie. Hereinafter, the series circuit of the equivalent resistance $R_m$, the equivalent inductor $L_m$, and the equivalent capacitance $C_m$ is referred to as an acoustic path 43, and the current Iac flowing through the acoustic path 43 is also referred to as an acoustic path current. Additionally, a path including the damping capacitance C0 and being connected in parallel to the acoustic path 43 is referred to as an electric path 44, and the current Ie flowing through the electric path 44 is also referred to as an electric path current. The specific resonator 4A includes the acoustic path 43 and the electric path 44. The acoustic path 43 and the electric path 44 are connected in parallel.

It is known that the distortion generated by the nonlinearity of an acoustic constant of an acoustic wave resonator has a proportional relationship with a magnitude of excitation per unit area of the acoustic wave resonator. The magnitude of excitation per unit area of the resonator 4A has a correlational relationship with the magnitude of a current per unit area of the acoustic path 43. Thus, the distortion generated by the nonlinearity of an acoustic constant of the resonator 4A has a proportional relationship with the magnitude of a current per unit area of the acoustic path 43. The unit area of the acoustic path 43 is proportional to the capacitance of the damping capacitance C0. Thus, when a value obtained by dividing a current value of the acoustic path current Iac by the capacitance of the damping capacitance C0 is defined as a current density Jac, it is possible to compare the nonlinear distortion generated by the nonlinearity of the acoustic constant of the resonator 4A by comparison of the current density Jac. The smaller the current density Jac is, the smaller the distortion generated by the nonlinearity of the acoustic constant of the resonator 4A is. When the unit of the current value of the acoustic path current Iac is mA and the unit of the capacitance of the damping capacitance C0 is pF, the unit of the current density Jac is mA/pF.

Figure 7:
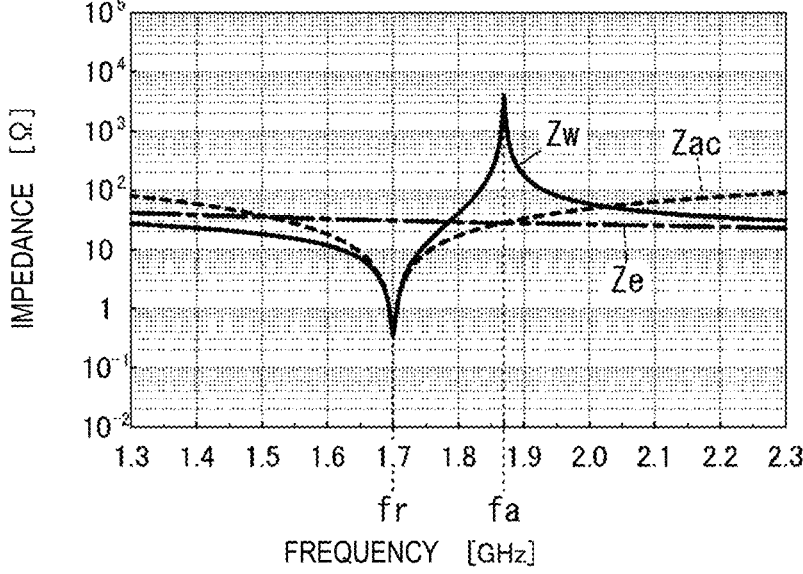
FIG. 7 is an impedance-frequency characteristic diagram of the resonator of the filter in the multiplexer described above.

FIG. 7 is a diagram illustrating impedance-frequency characteristics related to the resonator 4A illustrated in FIG. 5. In FIG. 7, the horizontal axis represents frequencies, and the vertical axis represents impedances. An impedance Zw of the resonator 4A has a local minimum value at a resonant frequency fr and a local maximum value at an anti-resonant frequency fa. When the frequency fa becomes higher than the anti-resonant frequency fa, the impedance Zw of the resonator 4A moves clockwise on the Smith chart and becomes a capacitive impedance. In FIG. 7, a frequency characteristic of the impedance Zw of the resonator 4A is indicated by a solid line, a frequency characteristic of the impedance Ze of the electric path 44 is indicated by a dashed-dotted line, and a frequency characteristic of the impedance Zac of the acoustic path 43 is indicated by a broken line.

As illustrated in FIG. 7, the impedance Zw of the resonator 4A and the impedance Zac of the acoustic path 43 are almost 0 at the resonant frequency fr. When an inductance of the equivalent inductor $L_m$ included in the acoustic path 43 is represented by $L_1$ and a capacitance of the equivalent capacitance $C_m$ included in the acoustic path 43 is represented by $C_1$, the resonant frequency fr is expressed by Equation (1).

$$f_r = \frac{1}{2\pi\sqrt{L_1 C_1}}$$

Equation (1)

As illustrated in FIG. 7, the impedance Zw of the resonator 4A has a local maximum value at the anti-resonant frequency fa. At the anti-resonant frequency fa higher than the resonant frequency fr, the impedance Zac becomes inductive. Thus, at the anti-resonant frequency fa, the acoustic path 43 can be regarded as a single inductive element, and the resonator 4A can be regarded as an LC parallel resonant circuit of the inductive element and the damping capacitance C0. Here, when an inductance of the inductive element is denoted by Lac and the capacitance of the damping capacitance C0 on the electric path 44 is denoted by C0e, the anti-resonant frequency fa is expressed by the following Equation (2).

$$f_a = \frac{1}{2\pi\sqrt{L_{ac} C0_e}}$$

Equation (2)

Figure 8:
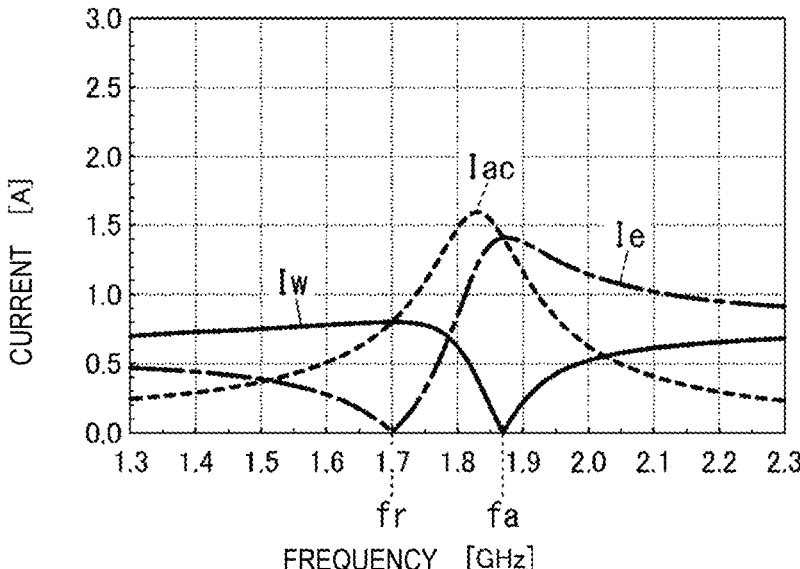
FIG. 8 is a current-frequency characteristic diagram of the resonator of the filter in the multiplexer described above.

FIG. 8 is a diagram illustrating current-frequency characteristics related to the resonator 4A. In FIG. 8, the horizontal axis represents frequencies, and the vertical axis represents currents. In FIG. 8, a frequency characteristic of the current Iw passing through the resonator 4A is indicated by a solid line, a frequency characteristic of the current Ie flowing through the electric path 44 is indicated by a dashed-dotted line, and a frequency characteristic of the current Iac flowing through the acoustic path 43 is indicated by a broken line.

As illustrated in FIG. 8, the current Ie rarely flows through the electric path 44 at the resonant frequency fr. The current Iac flowing through the acoustic path 43 at the resonant frequency fr is substantially equal to the current Iw flowing through the resonator 4A.

As illustrated in FIG. 8, the current Iw passing through the resonator 4A becomes locally minimum at the anti-resonant frequency fa. Additionally, at the anti-resonant frequency fa, the current Ie flowing through the electric path 44 and the current Iac flowing through the acoustic path 43 have substantially the same magnitude. This is because a current circulates in a closed circuit including the acoustic path 43 and the electric path 44 inside the resonator 4A. In this case, the current Ie of the electric path 44 and the current Iac of the acoustic path 43 have an opposite phase relationship. At the anti-resonant frequency fa, almost no current Iw passes through the resonator 4A, but a relatively large current flows inside the resonator 4A.

Figure 9:
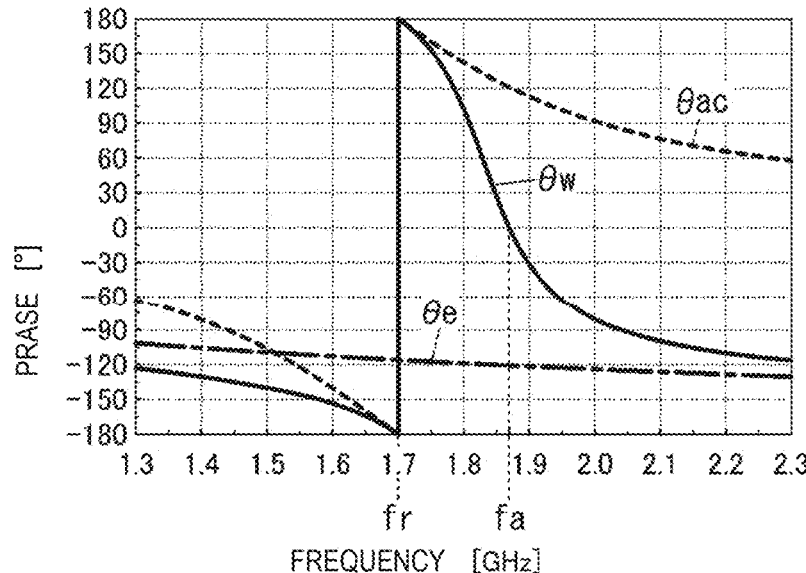
FIG. 9 is a phase-frequency characteristic diagram of the resonator of the filter in the multiplexer described above.

FIG. 9 is a diagram illustrating phase-frequency characteristics of the resonator 4A illustrated in FIG. 5. In FIG. 9, the horizontal axis represents frequencies, and the vertical axis represents phases. In FIG. 9, a phase θw of the current Iw passing through the resonator 4A is indicated by a solid line, a phase θe of the current Ie flowing through the electric path 44 is indicated by a dashed-dotted line, and a phase θac of the current Iac flowing through the acoustic path 43 is indicated by a broken line.

As can be seen from FIG. 9, the phase of the current Iac flowing through the acoustic path 43 at the anti-resonant frequency fa is a phase obtained by inverting the phase of the current Ie flowing through the electric path 44. When a current value of the current Iac flowing through the acoustic path 43 at the anti-resonant frequency fa is represented by $Iac_{fa}$, a current value of the current Ie flowing through the electric path 44 at the anti-resonant frequency fa is represented by $Ie_{fa}$, a Q value of the resonator 4A at the anti-resonant frequency fa is represented by Qa, a current value of the current Iw passing through the resonator 4A at the anti-resonant frequency fa is set to a reference current value $Iw_{fa}$, and an imaginary unit is represented by j, $Iac_{fa}$ and $Ie_{fa}$ are expressed by the following Equations (3) and (4), respectively.

$$Iac_{fa} = -j \cdot Qa \cdot Iw_{fa}$$

Equation (3)

$$Ie_{fa} = j \cdot Qa \cdot Iw_{fa}$$

Equation (4)

The current value $Iac_{fa}$ of the current Iac flowing through the acoustic path 43 at the anti-resonant frequency fa is Qa times the reference current value $Iw_{fa}$. Thus, in order to reduce the nonlinear distortion generated by the nonlinearity of the acoustic constant of the resonator 4A, it is necessary to reduce the reference current value $Iw_{fa}$.

Figure 10:
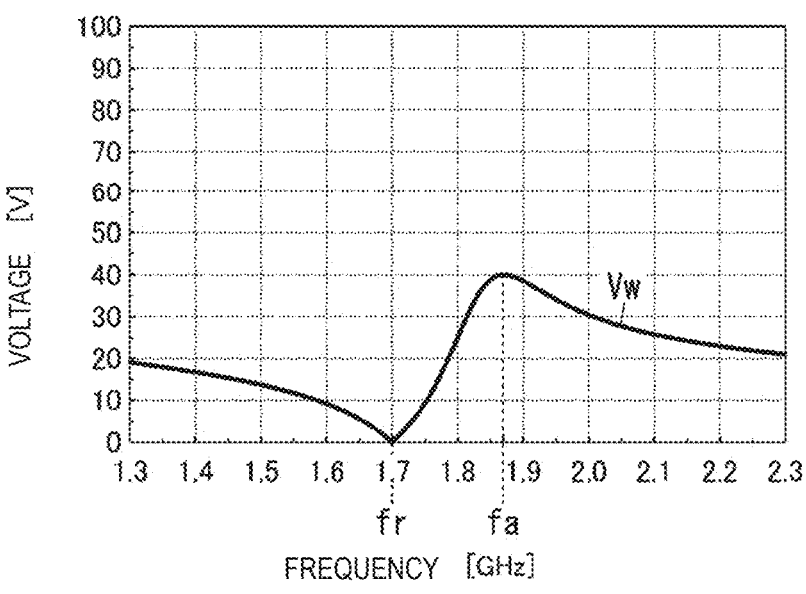
FIG. 10 is a voltage-frequency characteristic diagram of the resonator of the filter in the multiplexer described above.

FIG. 10 is a diagram illustrating voltage-frequency characteristics of the resonator 4A illustrated in FIG. 5. In FIG. 10, the horizontal axis represents frequencies, and the vertical axis represents voltages. In FIG. 10, a frequency characteristic of a voltage Vw of the resonator 4A is indicated by a solid line. A voltage of the electric path 44 and a voltage of the acoustic path 43 are the same as that of the resonator 4A.

In the resonator 4A, the larger the capacitance of the damping capacitance C0 is, the smaller the impedance Zw of the resonator 4A is. Additionally, in the resonator 4A, the larger the capacitance of the damping capacitance C0 is, the larger the current Iac flowing through the acoustic path 43 is. Additionally, in the resonator 4A, the larger the capacitance of the damping capacitance C0 is, the smaller a current density of the current Iac flowing through the acoustic path 43 is.

The current Iac flowing through the acoustic path 43 and the capacitance of the damping capacitance C0 in the equivalent electric circuit of the resonator 4A can be checked by, for example, the following method.

The resonator 4A is replaced with an equivalent circuit model (mBVD model) illustrated in FIG. 5 by using a circuit simulator such as an advanced design system (ADS), and characteristic fitting is performed on the waveform of an actually measured impedance and the filter characteristic by using the equivalent circuit model. Circuit constants of the equivalent inductor $L_m$, the equivalent capacitance $C_m$, the equivalent resistance $R_m$, and the damping capacitance C0 are determined by the characteristic fitting. This determines the capacitance of the damping capacitance C0. After the characteristic fitting, the current value of the acoustic path current Iac can be checked by calculating the current flowing through the acoustic path 43 in the resonator 4A by using an ammeter of the circuit simulator. By dividing the current value of the acoustic path current Iac by the capacitance of the damping capacitance C0, the current density Jac of the acoustic path current Iac can be derived.

The capacitance of the damping capacitance C0 can also be checked by the following method.

When the capacitances of the damping capacitances C0 of the plurality of resonators 4A are relatively compared, the magnitudes of the capacitances of the damping capacitances C0 can be compared by measuring the impedances of the resonators 4A by bringing a probe into contact with each of the first busbars 51 and the second busbars 52 of the resonators 4A or bringing a probe into contact with each of the first wiring portions 71 connected to the first busbars 51 and the second wiring portions 72 connected to the second busbars 52 of the resonators 4A, and comparing the frequency characteristics in a frequency region separated from the vicinity of the range from the resonant frequency fr to the anti-resonant frequency fa. It is also possible to obtain the capacitance of the damping capacitance C0 of the resonator 4A by applying a DC voltage to the resonator 4A.

(1.4) Third IMD (IMD3) of Multiplexer

In the multiplexer 1, the closer the resonator 4 is to the common terminal 2, the larger the distortion generated by the nonlinearity of the acoustic constant tends to be.

In the multiplexer 1, when two-uplink carrier aggregation using the first transmission filter 31 and the second transmission filter 33 is performed, IMD occurs. When a frequency included in the pass band of the first transmission filter 31 is denoted by f1 and a frequency included in the pass band of the second transmission filter 33 is denoted by f2, IMD3 satisfying f3=2×f1−f2 is generated in the vicinity of the first transmission band and the second transmission band. Thus, in a case where the pass band of the first reception filter 32 is relatively close to the pass band of the first transmission filter 31 and the pass band of the second transmission filter 33, IMD3 often becomes a problem. When the pass band of the first transmission filter 31 is from 1920 MHz to 1980 MHz and the pass band of the second transmission filter 33 is from 1710 MHz to 1785 MHz, a frequency band in which IMD3 occurs is from 2130 MHz to 2175 MHz.

In the multiplexer 1, a level and a phase of IMD3 of each resonator 4A can be expressed by the following Equation (5) and Equation (6) by using the current density and the capacitance of the damping capacitance C0.

$$\text{Level of IMD3}=|J_{B1TX}|^2 \times |J_{B3TX}| \times C0_{TX} \qquad \text{Equation (5)}$$

$$\text{Phase of IMD3}=2\theta_{B1TX} \pm \theta_{B3TX}, 2\theta_{B3TX} \pm \theta_{B1TX} \qquad \text{Equation (6)}$$

In Equation (5), $J_{B1TX}$ represents an acoustic path current density (complex number) in the transmission band of Band1, and $|J_{B1TX}|$ represents the magnitude of the acoustic path current in the transmission band of Band1. In addition, $J_{B3TX}$ represents the acoustic path current density (complex number) in the transmission band of Band3, and $|J_{B3TX}|$ represents the magnitude of the acoustic path current in the transmission band of Band3. Additionally, $C0_{TX}$ represents the capacitance of the damping capacitance C0. The level unit of IMD3 is $A^3/pF^2$. In Equation (6), $\theta_{B1TX}$ represents the phase of the acoustic path current in the transmission band of Band1. Further, $\theta_{B3TX}$ represents the phase of the acoustic path current in the transmission band of Band3.

Figures 11A, 11B, 11C, 11D:
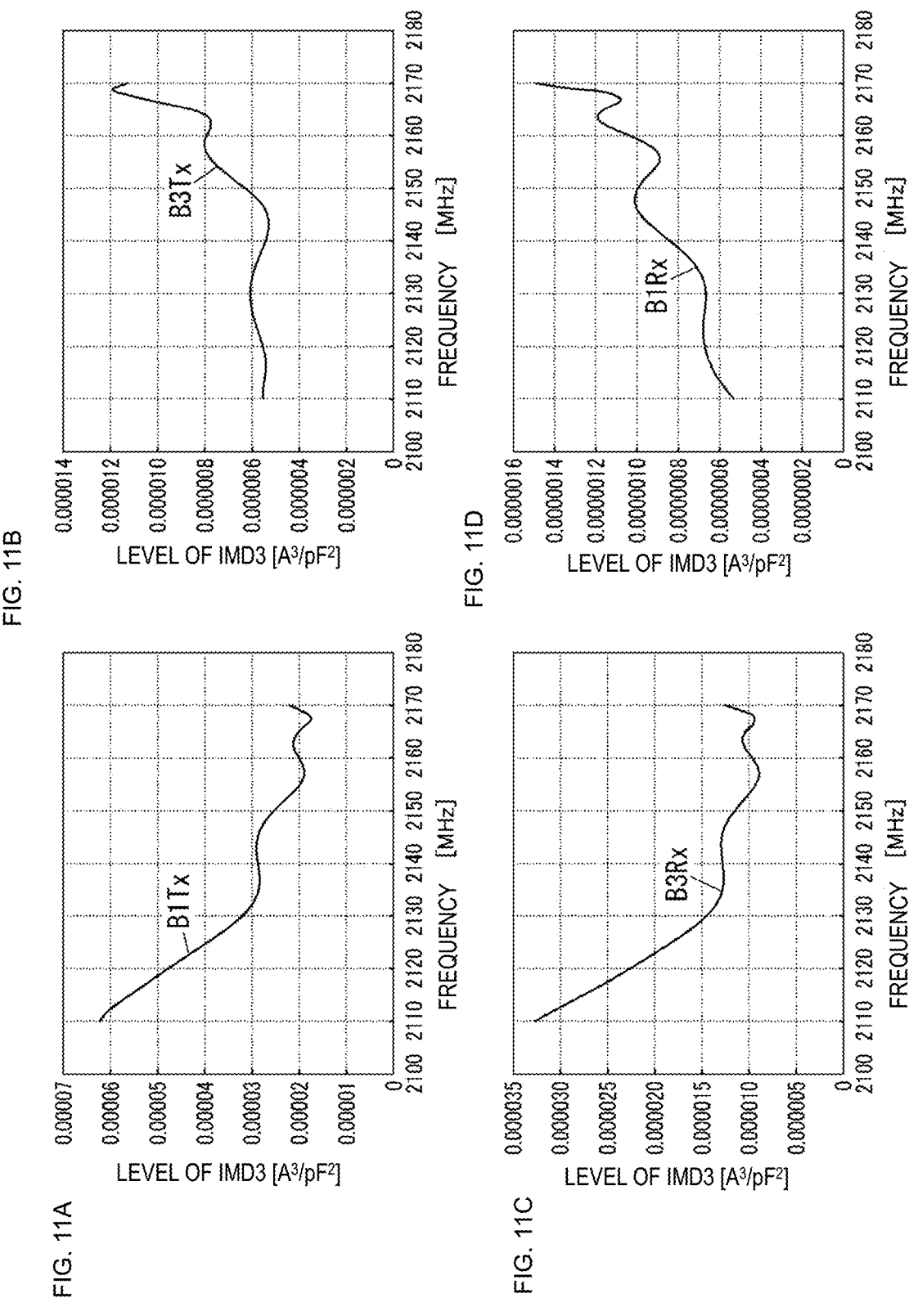
FIG. 11A is a third order intermodulation distortion (IMD3) level-frequency characteristic diagram of a first transmission filter in the multiplexer described above.
FIG. 11B is an IMD3 level-frequency characteristic diagram of a second transmission filter in the multiplexer described above.
FIG. 11C is an IMD3 level-frequency characteristic diagram of a first reception filter in the multiplexer described above.
FIG. 11D is an IMD3 level-frequency characteristic diagram of a second reception filter in the multiplexer described above.

FIG. 11A represents a frequency characteristic of a level of IMD3 generated in the reception band of the second reception filter 34 as for the specific resonator 4A (parallel arm resonator P14) in the first transmission filter 31 having a pass band including the transmission band of Band1. FIG. 11B represents a frequency characteristic of a level of IMD3 generated in the reception band of the second reception filter 34 as for the specific resonator 4A (series arm resonator S34) in the second transmission filter 33 having a pass band including the transmission band of Band3. FIG. 11C represents a frequency characteristic of a level of IMD3 generated in the reception band of the second reception filter 34 as for the specific resonator 4A (series arm resonator S44) of the first reception filter 32 having a pass band including the reception band of Band3. FIG. 11D represents a frequency characteristic of a level of IMD3 generated in the reception band of the second reception filter 34 as for the specific resonator 4A (series arm resonator S24) of the second reception filter 34 having a pass band including the reception band of Band1. FIGS. 11A to 11D are results of evaluating IMD generated in the reception band of Band1 (2110 MHz to 2170 MHz) in a case where power of +26 dBm is input into the transmission band of Band1 with respect to the multiplexer 1 and a signal in the transmission band of Band3 is input from the common terminal 2 with power of +10 dBm. In the multiplexer 1, since the pass bands of the filters 3 are close to each other, when strong power is input, not only the specific resonator 4A of the first transmission filter 31 and the second transmission filter 33 but also the specific resonator 4A of the first reception filter 32 can be a generation source of IMD. In this case, the resonant frequency and the anti-resonant frequency of the parallel arm resonator P14 serving as the specific resonator 4A of the first transmission filter 31 corresponding to the transmission band of Band1 are close to those of the series arm resonator S44 serving as the specific resonator 4A of the first reception filter 32 corresponding to the reception band of Band3, respectively. Thus, the tendencies of the levels of IMD3 generated therein are similar to each other. As can be seen from FIGS. 11A to 11D, in the first transmission filter 31 having a pass band including the transmission band of Band1 and the first reception filter 32 having a pass band including the reception band of Band3, the levels of IMD3 tend to decrease as frequencies increase, and the tendencies are similar to each other. In the second transmission filter 33 having a pass band including the transmission band of Band3 and the second reception filter 34 having a pass band including the reception band of Band1, the levels of IMD3 tend to increase as frequencies increase, and the tendencies are different from that of the first transmission filter 31 having a pass band including the transmission band of Band1. In addition, from FIGS. 11A to 11D, it is understood that the level of IMD3 of the first transmission filter 31 (see B1Tx in FIG. 11A) and the level of IMD3 of the first reception filter 32 (see B3Rx in FIG. 11C) are higher than the levels of IMD3 of the other filters 3, that is, the level of IMD3 of the second transmission filter 33 (see B3Tx in FIG. 11B) and the level of IMD3 of the second reception filter 34 (see B1Rx in FIG. 11D).

For the multiplexer 1, $I1_{TX1}$, $I2_{TX1}$, $C0_{TX1}$, $I1_{TX2}$, $I2_{TX2}$, $C0_{TX2}$, $I1_{RX1}$, $I2_{RX1}$, $C0_{RX1}$, $I1_{RX2}$, $I2_{RX2}$, and $C0_{RX2}$ are defined as follows.

$I1_{TX1}$ is a density of an acoustic path current at the common terminal 2 side of the first transmission filter 31 at a frequency within the first transmission band. $I2_{TX1}$ is a density of an acoustic path current at the common terminal 2 side of the first transmission filter 31 at a frequency within the second transmission band. $C0_{TX1}$ is a capacitance of the damping capacitance C0 of the specific resonator 4A in the first transmission filter 31. $I1_{TX2}$ is a density of an acoustic path current at the common terminal 2 side of the second transmission filter 33 at a frequency within the first transmission band. $I2_{TX2}$ is a density of an acoustic path current at the common terminal 2 side of the second transmission filter 33 at a frequency within the second transmission band. $C0_{TX2}$ is a capacitance of the damping capacitance C0 of the specific resonator 4A in the second transmission filter 33. $I1_{RX1}$ is a density of an acoustic path current at the common terminal 2 side of the first reception filter 32 at a frequency within the first transmission band. $I2_{RX1}$ is a density of an acoustic path current at the common terminal 2 side of the first reception filter 32 at a frequency within the second transmission band. $C0_{RX1}$ is a capacitance of the damping capacitance C0 of the specific resonator 4A in the first reception filter 32. I1$_{RX2}$ is a density of an acoustic path current at the common terminal 2 side of the second reception filter 34 at a frequency within the first transmission band. I2$_{RX2}$ is a density of an acoustic path current at the common terminal 2 side of the second reception filter 34 at a frequency within the second transmission band. C0$_{RX2}$ is a capacitance of the damping capacitance C0 of the specific resonator 4A in the second reception filter 34.

In the multiplexer 1, as described above, the level of IMD3 of the first transmission filter 31 and the level of IMD3 of the first reception filter 32 are higher than the levels of IMD3 of the other filters 3, that is, the level of IMD3 of the second transmission filter 33 and the level of IMD3 of the second reception filter 34. Thus, the multiplexer 1 satisfies a third condition, a fourth condition, a fifth condition, and a sixth condition.

The third condition is as follows.

$$(I1_{Tx1})^2 \cdot (I2_{Tx1}) \cdot C0_{Tx1} > (I1_{Tx2})^2 \cdot (I2_{Tx2}) \cdot C0_{Tx2}$$

The fourth condition is as follows.

$$(I1_{Tx1})^2 \cdot (I2_{Tx1}) \cdot C0_{Tx1} > (I1_{Rx2})^2 \cdot (I2_{Rx2}) \cdot C0_{Rx2}$$

The fifth condition is as follows.

$$(I1_{Rx1})^2 \cdot (I2_{Rx1}) \cdot C0_{Rx1} > (I1_{Tx2})^2 \cdot (I2_{Tx2}) \cdot C0_{Tx2}$$

The sixth condition is as follows.

$$(I1_{Rx1})^2 \cdot (I2_{Rx1}) \cdot C0_{Rx1} > (I1_{Rx2})^2 \cdot (I2_{Rx2}) \cdot C0_{Rx2}$$

The resonator 4 closest to the common terminal 2 is often a dominant factor in IMD3 of the filter 3. In the multiplexer 1 according to Preferred Embodiment 1, the level of IMD3 of the specific resonator 4A of the first transmission filter 31 and the level of IMD3 of the specific resonator 4A of the first reception filter 32 are higher than the levels of IMD3 of the specific resonators 4A of the other filters 3 (the second transmission filter 33 and the second reception filter 34). Thus, in a case of the multiplexer 1 according to Preferred Embodiment 1, IMD3 of the specific resonator 4A of the first transmission filter 31 and IMD3 of the specific resonator 4A of the first reception filter 32 are often dominant factors. Thus, as long as in the specific resonator 4A of the first transmission filter 31 and the specific resonator 4A of the first reception filter 32, the phase of IMD3 is within 180°±90° (the phase of IMD3 has a value being equal to or larger than 90° and equal to or smaller than 270° because ±90° indicates a range from −90° to +90°), IMD3 of the multiplexer 1 as a whole can be improved. When the levels of IMD3 are substantially the same, IMD3 of the multiplexer 1 as a whole can be further improved.

In the multiplexer 1, when the generation levels of IMD from two generation sources of IMD are substantially the same and the phases thereof are substantially opposite to each other (are shifted by 180° from each other), IMD and IMD cancel each other and become almost invisible. Since the level of IMD3 of the specific resonator 4A (parallel arm resonator P14) of the first transmission filter 31 and the level of IMD3 of the specific resonator 4A (series arm resonator S44) of the first reception filter 32 have similar tendencies as described above, IMD3 can be reduced in a case where the levels of IMD3 can be adjusted and the phases thereof can be made substantially opposite to each other. In the multiplexer 1 according to Preferred Embodiment 1, for example, the levels of IMD3 are changed by changing the capacitances of the damping capacitances C0 between the specific resonator 4A of the first transmission filter 31 and the specific resonator 4A of the first reception filter 32. When the capacitance of the damping capacitance C0 is increased, the level of IMD3 is decreased, and when the capacitance of the damping capacitor C0 is decreased, the level of IMD3 is increased. Regarding the level of IMD3, it is assumed that the capacitances of the damping capacitances C0 of the specific resonators 4A of the first transmission filter 31 and the first reception filter 32 are the same, the level of IMD3 of the specific resonator 4A of the first transmission filter 31 to which larger power is input, of the first transmission filter 31 and the first reception filter 32, is larger than that of the specific resonator 4A of the first reception filter 32. Thus, for example, by setting the capacitance of the damping capacitance C0 of the specific resonator 4A (the series arm resonator S44) in the first reception filter 32 to be smaller than the capacitance of the damping capacitance C0 of the specific resonator 4A (the parallel arm resonator P14) in the first transmission filter 31, the level of IMD3 of the resonator 4A in the first transmission filter 31 and the level of IMD3 of the resonator 4A in the first reception filter 32 can be made equal to each other (the difference between the levels of IMD3 can be reduced). Table 1 shows an example of the capacitance of the damping capacitance C0 of the specific resonator 4A of each filter 3.

TABLE 1

| | B3Tx S34 | B3Rx S44 | B1Tx P14 | B1Rx S24 | Unit |
|---|---|---|---|---|---|
| Area | 4600.9 | 4635.5 | 9394.1 | 2335.1 | μm · pairs |
| C0 | 1.932 | 1.946 | 3.946 | 0.981 | pF |

In Table 1, B3Tx indicates the second transmission filter 33, B3Rx indicates the first reception filter 32, B1Tx indicates the first transmission filter 31, and B1Rx indicates the second reception filter 34. In Table 1, S34 indicates the series arm resonator S34, S44 indicates the series arm resonator S44, P14 indicates the parallel arm resonator P14, and S24 indicates the series arm resonator S24. Additionally, in Table 1, an area indicates the product of the intersecting width of the first electrode fingers 53 and the second electrode fingers 54 (the width W55 of the intersection region 55 in the third direction D3) and the number of pairs of the first electrode fingers 53 and the second electrode fingers 54. That is, the size relationship of the areas in Table 1 is the same as the size relationship of the areas of the intersection regions 55.

It can be seen from Table 1 that the capacitance of the damping capacitance C0 of the specific resonator 4A (parallel arm resonator P14) in the first transmission filter 31 is 3.946 pF, whereas the capacitance of the damping capacitance C0 of the specific resonator 4A (series arm resonator S44) in the first reception filter 32 is 1.946 pF.

Figure 12:
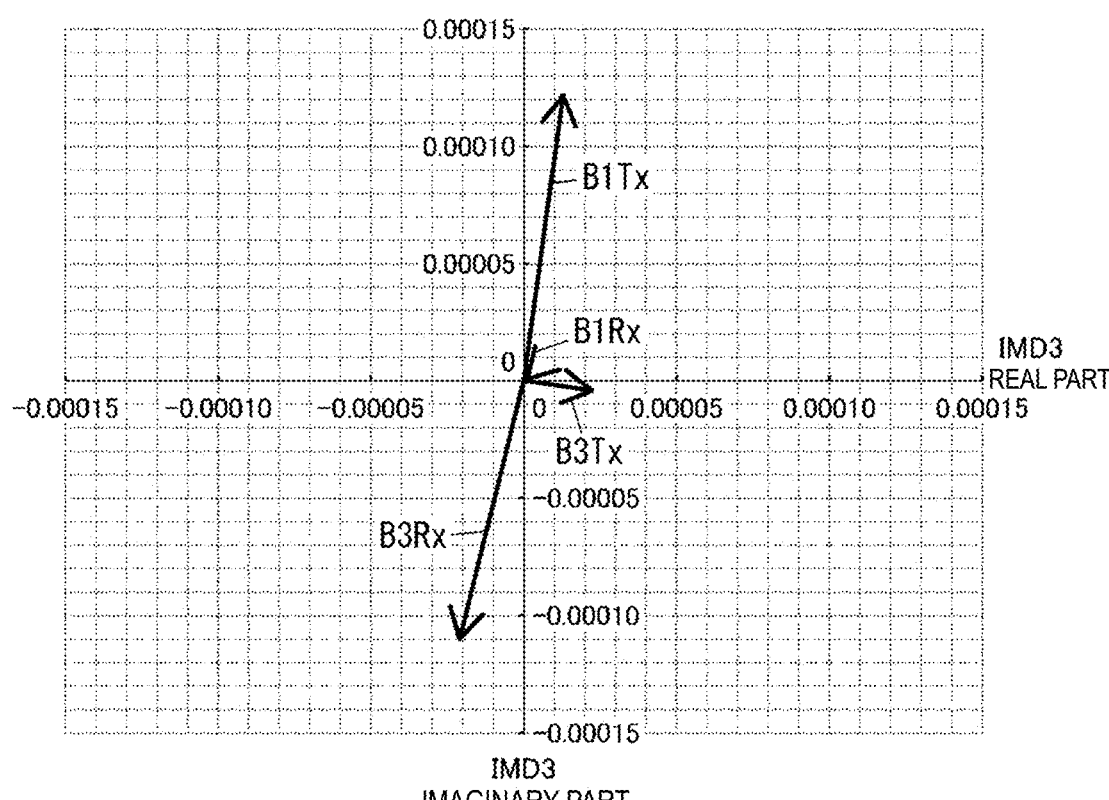
FIG. 12 is an explanatory diagram of IMD3 of specific resonators of a plurality of filters in the multiplexer described above.

FIG. 12 is a diagram illustrating, as vectors, the magnitude and phase of IMD3 of the specific resonator 4A of each filter 3 at frequencies at which IMD3 is generated in the multiplexer 1. In FIG. 12, the horizontal axis represents the real part of IMD3 represented by a complex number, and the vertical axis represents the imaginary part of IMD3. Further, in FIG. 12, B1Tx indicates a vector of IMD3 of the first transmission filter 31, B3Tx indicates a vector of IMD3 of the second transmission filter 33, B3Rx indicates a vector of IMD3 of the first reception filter 32, and B1Rx indicates a vector of IMD3 of the second reception filter 34. As can be seen from FIG. 12, the specific resonator 4A (series arm resonator S44) of the first reception filter 32 and the specific resonator 4A (parallel arm resonator P14) of the first transmission filter 31 have substantially opposite phases of IMD3 to each other, and have substantially the same magnitude of IMD3. Thus, in the multiplexer 1, IMD3 of two filters 3 having larger levels of IMD3 among the plurality of filters 3 is canceled, and the total level of IMD3 becomes small.

The phase of IMD can be adjusted by a plurality of phase shift circuits 8 that correspond one-to-one to the plurality of filters 3 and that are connected between the plurality of filters 3 and the common terminal 2. Since IMD3 generated in the specific resonator 4A of each filter 3 passes through the phase shift circuit 8 and reaches the second reception filter 34 whose pass band includes the frequency band where IMD3 is generated, allowing the phase of IMD3 to be changed by providing the phase shift circuit 8 between each filter 3 and the common terminal 2. The phase shift circuit 8 may be an inductor, or a capacitor, a circuit obtained by combining an inductor and a capacitor, or a wiring line (transmission line). Each phase shift circuit 8 is provided to adjust the phase of IMD3 from the corresponding filter 3 to the common terminal 2, but is not necessarily provided. However, in the multiplexer 1, it is preferable that the first phase shift circuit 81 be provided between the first transmission filter 31 and the common terminal 2. This is because the first transmission filter 31 is the filter 3 to which the strongest power is input among the plurality of filters 3 and has a large influence on IMD3, and thus, it is easy to adjust IMD3 by phase adjustment.

(1.5) Structure of Specific Resonator

In the multiplexer 1 according to Preferred Embodiment 1, as described above, the capacitance of the damping capacitance C0 of the specific resonator 4A (series arm resonator S44) in the first reception filter 32 is smaller than the capacitance of the damping capacitance C0 of the specific resonator 4A (parallel arm resonator P14) in the first transmission filter 31.

Figure 13B:
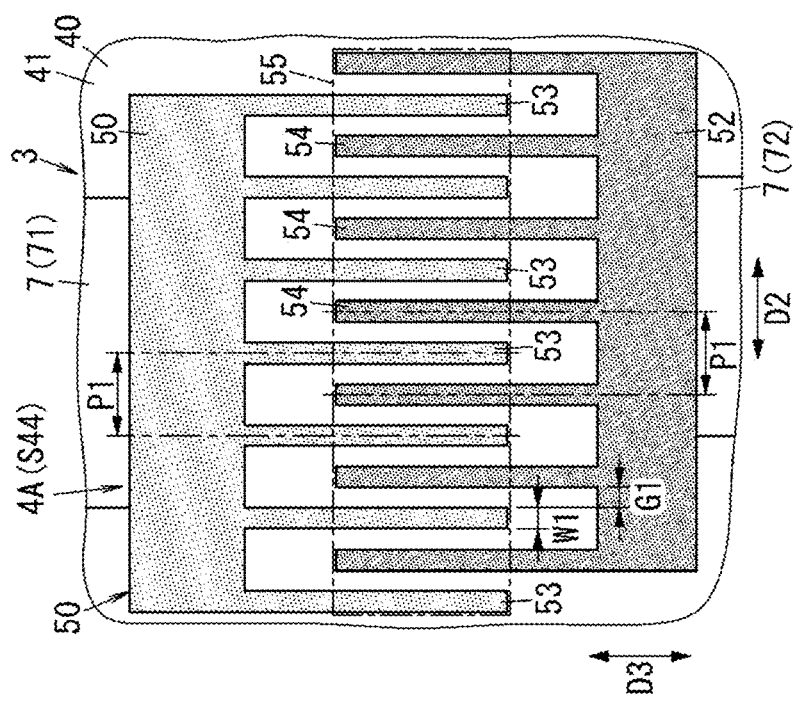
FIG. 13B is a plan view of a specific resonator of the first reception filter in the multiplexer described above.
Figure 13A:
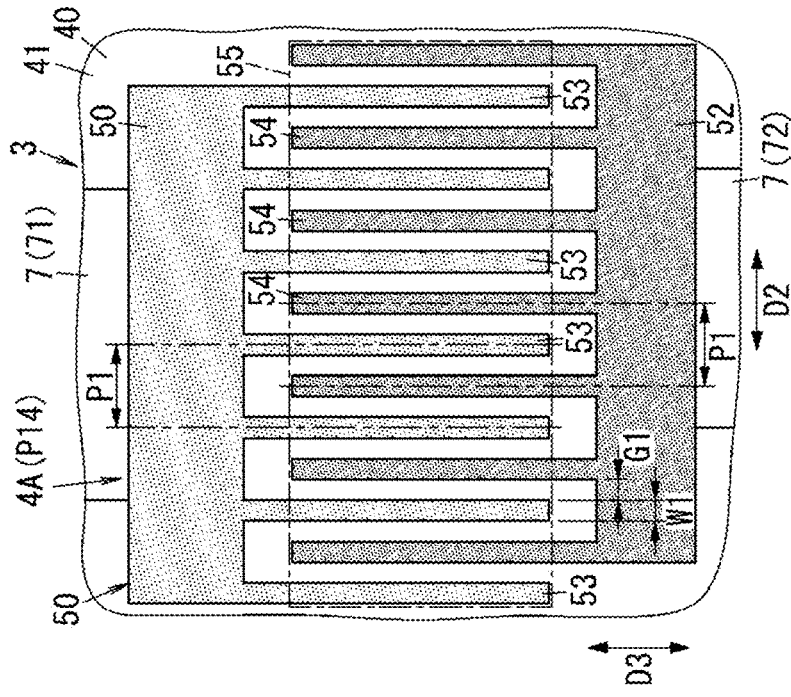
FIG. 13A is a plan view of a specific resonator of the first transmission filter in the multiplexer described above.

FIG. 13A is a plan view of the specific resonator 4A (parallel arm resonator P14) in the first transmission filter 31, and FIG. 13B is a plan view of the specific resonator 4A (series arm resonator S44) in the first reception filter 32. In the specific resonator 4A (in FIG. 13B) in the first reception filter 32, the intersecting width of the first electrode fingers 53 and the second electrode fingers 54 is small and the area of the intersection region 55 is small, compared to those in the specific resonator 4A (in FIG. 13A) in the first transmission filter 31. Thus, the capacitance of the damping capacitance C0 of the specific resonator 4A (series arm resonator S44) in the first reception filter 32 is likely to be made smaller than the capacitance of the damping capacitance C0 of the specific resonator 4A (parallel arm resonator P14) in the first transmission filter 31.

(2) Conclusion

The multiplexer 1 according to Preferred Embodiment 1 includes a common terminal 2 and a plurality of filters 3. The plurality of filters 3 are connected to the common terminal 2. Each of the plurality of filters 3 includes a plurality of resonators 4. The plurality of filters 3 include a first transmission filter 31, a second transmission filter 33, and a first reception filter 32. The first transmission filter 31 has a pass band including a first transmission band. The second transmission filter 33 has a pass band including a second transmission band different from the first transmission band. The first reception filter 32 has a pass band including a first reception band. A center frequency of the first reception band is between a center frequency of the first transmission band and a center frequency of the second transmission band. In the multiplexer 1, in a case where an electric equivalent circuit of the specific resonator 4A among the plurality of resonators 4 in each of the plurality of filters 3 is represented by using a parallel circuit including a series circuit of an equivalent resistance $R_m$, an equivalent inductor $L_m$, and an equivalent capacitance $C_m$, and a damping capacitance C0, and a current flowing through the damping capacitance C0 is defined as an acoustic path current Iac, under conditions that a phase of an acoustic path current Iac of the first transmission filter 31 at a side of the common terminal 2 at a frequency in the first transmission band is represented as $\theta1_{Tx}$, a phase of an acoustic path current Iac of the first transmission filter 31 at the side of the common terminal 2 at a frequency in the second transmission band is represented as $\theta2_{Tx}$, a phase of an acoustic path current Iac of the first reception filter 32 at the side of the common terminal 2 at a frequency in the first transmission band is represented as $\theta1_{Rx}$, and a phase of an acoustic path current Iac of the first reception filter 32 at the side of the common terminal 2 at a frequency in the second transmission band is represented as $\theta2_{Rx}$, the multiplexer 1 satisfies a first condition or a second condition. The first condition is a condition that $|(2\cdot\theta1_{Tx}-\theta2_{Tx})-(2\cdot\theta1_{Rx}-\theta2_{Rx})|=180°\pm90°$. The second condition is a condition that $|(2\cdot\theta2_{Tx}-\theta1_{Tx})-(2\cdot\theta2_{Rx}-\theta1_{Rx})|=180°\pm90°$.

The multiplexer 1 according to Preferred Embodiment 1 can suppress the occurrence of IMD. Thus, the multiplexer 1 according to Preferred Embodiment 1 can suppress deterioration in reception sensitivity of the reception filter (the first reception filter 32). In the multiplexer 1 according to Preferred Embodiment 1, for example, in a case where the first transmission filter 31 and the first reception filter 32 have the same level of IMD3, when a difference between a phase of IMD3 of the first transmission filter 31 and a phase of IMD3 of the first reception filter 32 is 180°, IMD3 of the first transmission filter 31 and IMD3 of the first reception filter 32 are cancelled. The present preferred embodiment is not limited to the case where the difference in phase between IMD3 of the first transmission filter 31 and IMD3 of the first reception filter 32 is 180°, and the total level of IMD3 can be reduced as long as the difference is within a range being equal to or larger than 90° and equal to or smaller than 270°. The multiplexer 1 according to Preferred Embodiment 1 further includes the second reception filter 34, but can suppress IMD generated in the second reception band of the second reception filter 34, and thus, can suppress deterioration in reception sensitivity of the second reception filter 34.

(3) Modifications (3.1) Modification 1

A circuit configuration of the multiplexer 1 according to Modification 1 of Preferred Embodiment 1 is the same as the circuit configuration of the multiplexer 1 (see FIGS. 1 and 6) according to Preferred Embodiment 1, and thus, illustration and description thereof will be omitted. Hereinafter, the multiplexer 1 according to Modification 1 will be described with reference to FIGS. 14A and 14B.

Figure 14B:
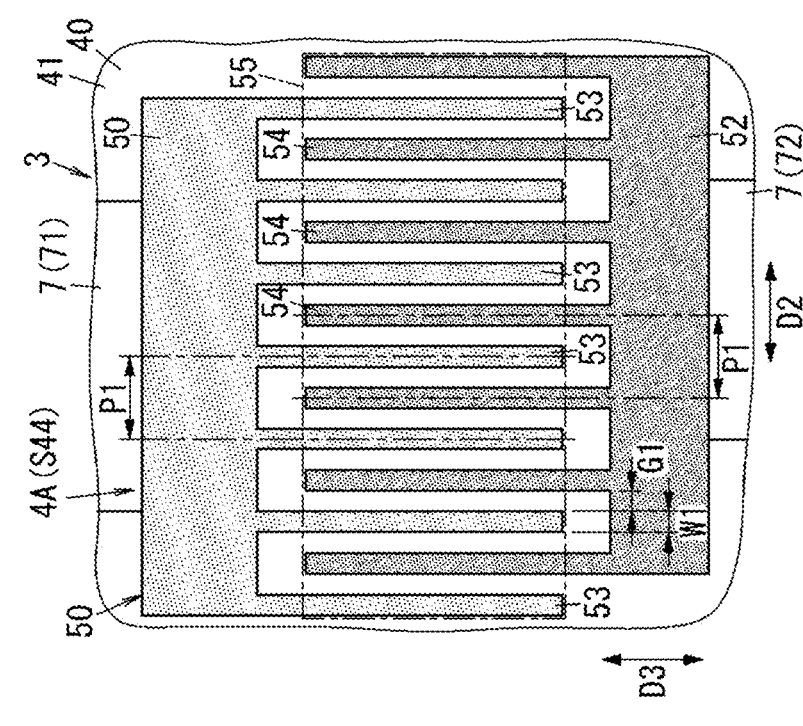
FIG. 14B is a plan view of a specific resonator of a first reception filter in the multiplexer described above.
Figure 14A:
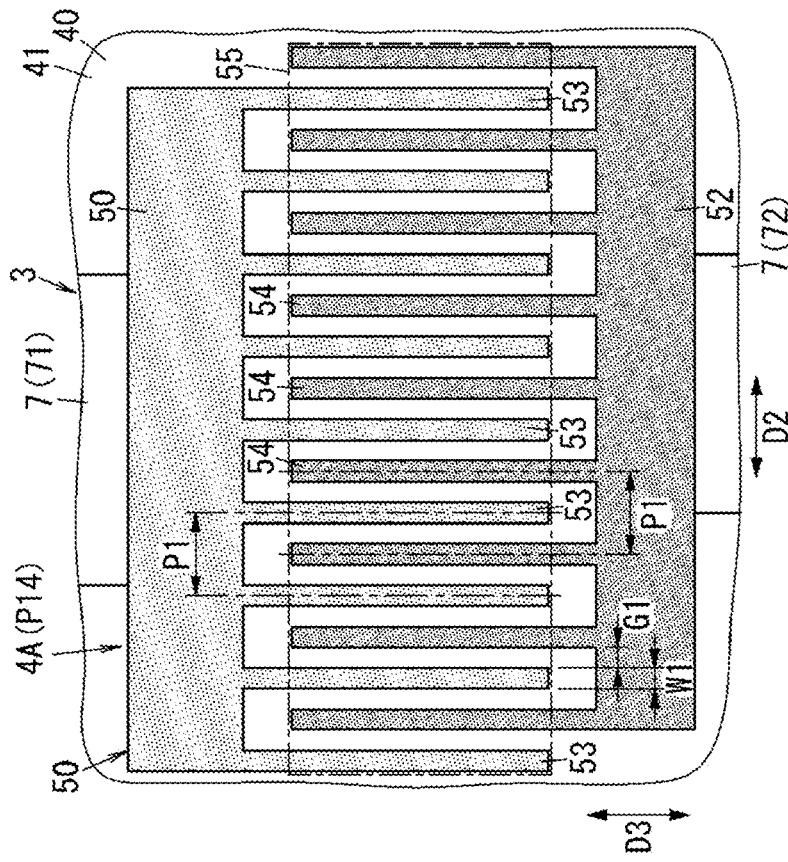
FIG. 14A is a plan view of a specific resonator of a first transmission filter in a multiplexer according to Modification 1 of Preferred Embodiment 1 of the present invention.

FIG. 14A is a plan view of the specific resonator 4A (parallel arm resonator P14) in the first transmission filter 31, and FIG. 14B is a plan view of the specific resonator 4A (series arm resonator S44) in the first reception filter 32. In the specific resonator 4A (in FIG. 14B) in the first reception filter 32, the number of pairs of the first electrode fingers 53 and the second electrode fingers 54 is small, and the area of the intersection region 55 is small, compared to those of the specific resonator 4A (in FIG. 14A) in the first transmission filter 31. Thus, the capacitance of the damping capacitance C0 of the specific resonator 4A (series arm resonator S44) in the first reception filter 32 can be made smaller than the capacitance of the damping capacitance C0 of the specific resonator 4A (parallel arm resonator P14) in the first transmission filter 31.

Also, even when the capacitance of the damping capacitance C0 of the specific resonator 4A (parallel arm resonator P14) in the first transmission filter 31 is the same as the capacitance of the damping capacitance C0 of the specific resonator 4A (series arm resonator S44) in the first reception filter 32, the power density of the parallel arm resonator P14 can be reduced by making the area of the parallel arm resonator P14 larger than the area of the series arm resonator S44, and thus, the level of IMD3 can be reduced.

(3.2) Modification 2

A circuit configuration of the multiplexer 1 according to Modification 2 of Preferred Embodiment 1 is substantially the same as the circuit configuration of the multiplexer 1 (see FIGS. 1 and 6) according to Preferred Embodiment 1, and thus, illustration and description thereof will be omitted. Hereinafter, the multiplexer 1 according to Modification 1 will be described with reference to FIGS. 15A, 15B, 16A, and 16B.

Figure 15A:
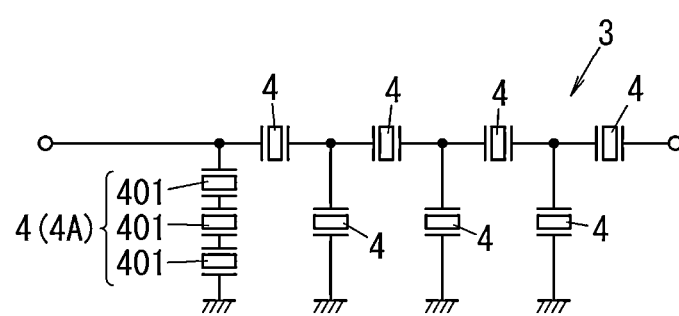
FIG. 15A is a circuit diagram of a first transmission filter in a multiplexer according to Modification 2 of Preferred Embodiment 1 of the present invention.
Figure 15B:
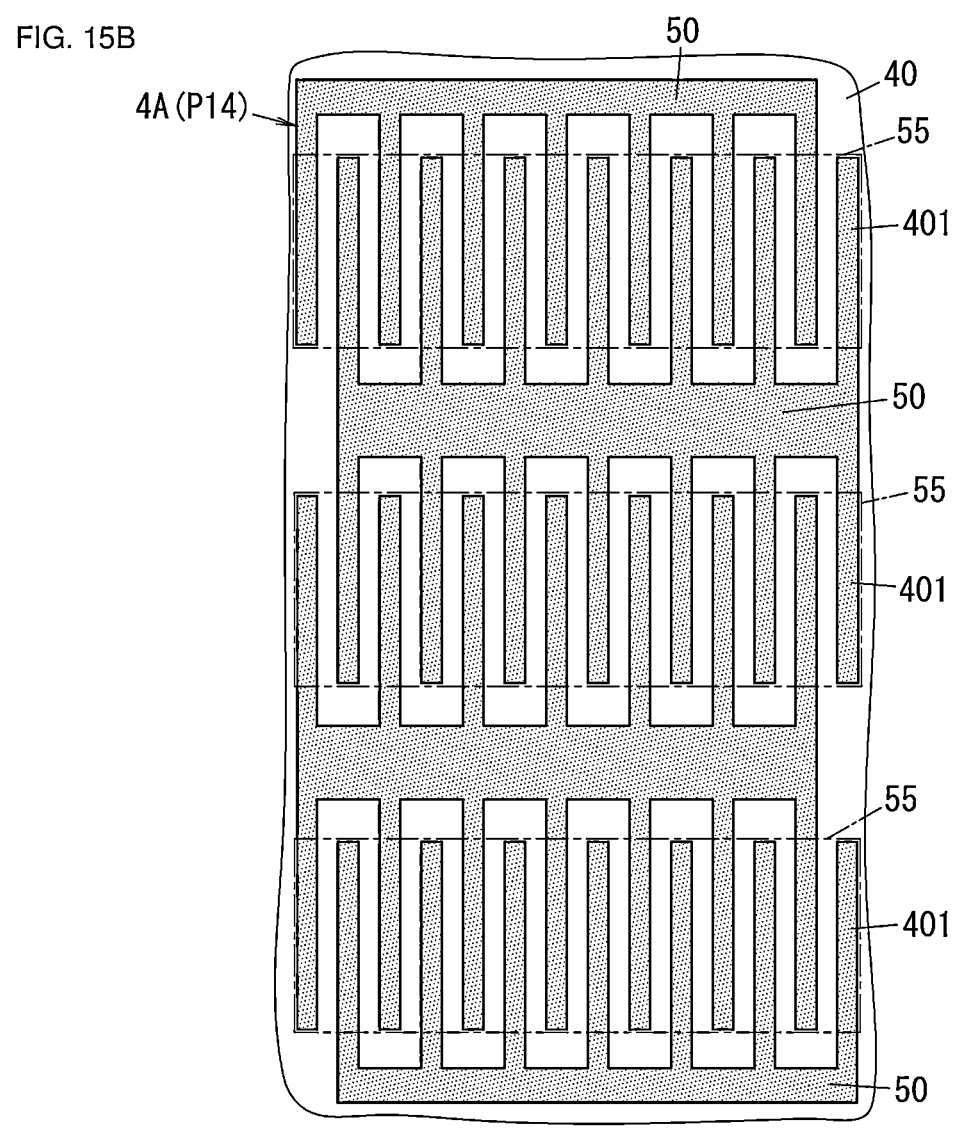
FIG. 15B is a plan view of a specific resonator in the first transmission filter described above.
Figure 16A:
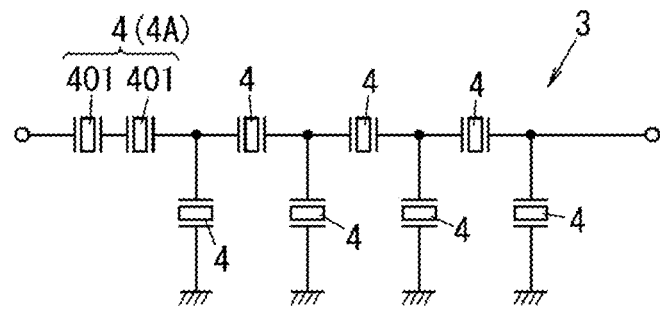
FIG. 16A is a circuit diagram of a first reception filter in the multiplexer described above.
Figure 16B:
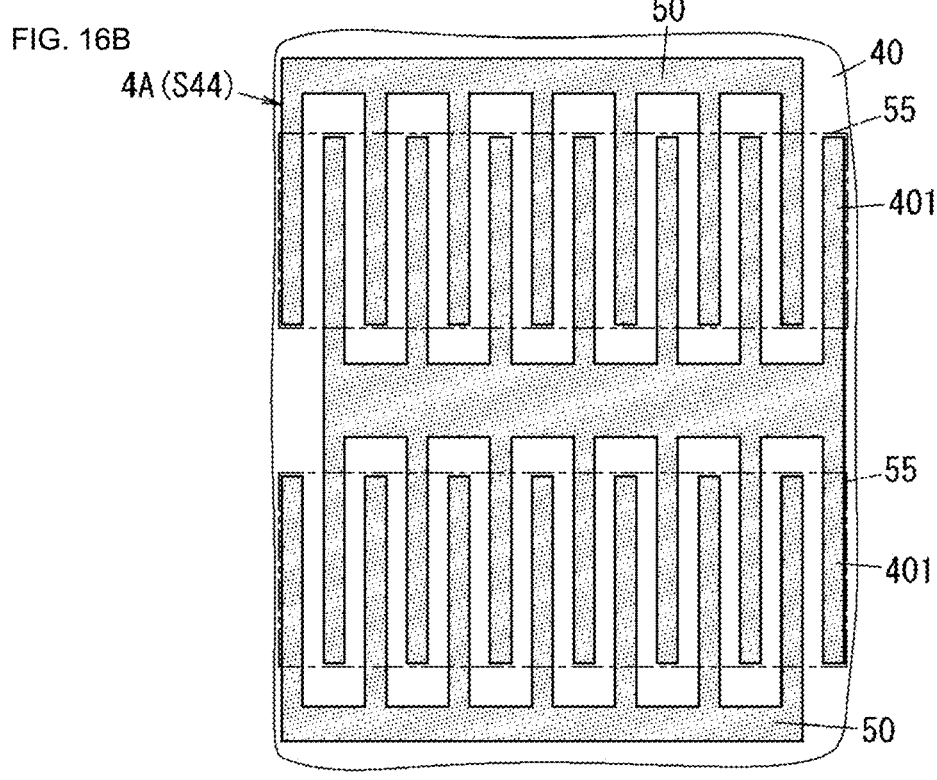
FIG. 16B is a plan view of a specific resonator in the first reception filter described above.

FIG. 15A is a circuit diagram in which the specific resonator 4A (parallel arm resonator P14) in the first transmission filter 31 includes three division resonators 401, and FIG. 15B is a plan view of the specific resonator 4A in the first transmission filter 31. Here, the three division resonators 401 are resonators obtained by dividing the specific resonator 4A (parallel arm resonator P14), and are connected in series without interposing another resonator 4 therebetween and without interposing a connection node with a path including another resonator 4. FIG. 16A is a circuit diagram in which the specific resonator 4A (series arm resonator S44) in the first reception filter 32 includes two division resonators 401, and FIG. 16B is a plan view of the specific resonator 4A in the first reception filter 32. Here, the two division resonators 401 are resonators obtained by dividing the specific resonator 4A (series arm resonator S44), and are connected in series without interposing another resonator 4 therebetween and without interposing a connection node with a path including another resonator 4 therebetween. An area of the specific resonator 4A in FIG. 15B is the sum of areas of three intersection regions 55. An area of the specific resonator 4A in FIG. 16B is the sum of areas of two intersection regions 55. In FIGS. 15B and 16B, the areas of the intersection regions 55 of each of the division resonators 401 are the same.

In the multiplexer 1 according to Modification 2 of Preferred Embodiment 1, even when the capacitance of the damping capacitance C0 of the specific resonator 4A (parallel arm resonator P14) in the first transmission filter 31 is the same as the capacitance of the damping capacitance C0 of the specific resonator 4A (series arm resonator S44) in the first reception filter 32, the power density of the parallel arm resonator P14 can be reduced by making the area of the parallel arm resonator P14 larger than the area of the series arm resonator S44, and thus, the level of IMD3 can be reduced. A plurality of division resonators 401 in the specific resonator 4 preferably have the same area of the intersection region 55 as each other, but the present invention is not limited thereto, and the areas of the intersection regions 55 may be substantially the same.

In the multiplexer 1 according to Modification 2 of Preferred Embodiment 1, the division number of the specific resonator 4A in the first transmission filter 31 is only required to be larger than the division number of the specific resonator 4A in the first reception filter 32, and the division number of the specific resonator 4A in the first transmission filter 31 and the division number of the specific resonator 4A in the first reception filter 32 are not particularly limited.

(3.3) Modification 3

A circuit configuration of the multiplexer 1 according to Modification 3 of Preferred Embodiment 1 is the same as the circuit configuration of the multiplexer 1 (see FIGS. 1 and 6) according to Preferred Embodiment 1, and thus, illustration and description thereof will be omitted. Hereinafter, the multiplexer 1 according to Modification 1 will be described with reference to FIGS. 17A and 17B.

FIG. 17A is a plan view of the specific resonator 4A (parallel arm resonator P14) in the first transmission filter 31, and FIG. 17B is a plan view of the specific resonator 4A (series arm resonator S44) in the first reception filter 32. A duty=W12/(W12+G12), of the specific resonator 4A (FIG. 17B) in the first reception filter 32, when a width of the first electrode finger 53 in the second direction D2 is denoted by W12 and an interval between the first electrode finger 53 and the second electrode finger 54 that are adjacent to each other in the second direction D2 is denoted by G12, is smaller than a duty=W11/(W11+G11), of the specific resonator 4A (FIG. 17A) in the first transmission filter 31, when a width of the first electrode finger 53 in the second direction D2 is denoted by W11 and an interval between the first electrode finger 53 and the second electrode finger 54 that are adjacent to each other in the second direction D2 is denoted by G11. Thus, the capacitance of the damping capacitance C0 of the specific resonator 4A (series arm resonator S44) in the first reception filter 32 can be made smaller than the capacitance of the damping capacitance C0 of the specific resonator 4A (parallel arm resonator P14) in the first transmission filter 31.

In the multiplexer 1 according to Modification 3 of Preferred Embodiment 1, the duty of the specific resonator 4A in the first reception filter 32 is set to 0.3, and the duty of the specific resonator 4A in the first transmission filter 31 is set to 0.5. However, these values are merely examples and the present preferred embodiment is not limited to these values. In the multiplexer 1 according to Modification 3 of Preferred Embodiment 1, the duty of the specific resonator 4A in the first reception filter 32 is smaller than the duty of the specific resonator 4A in the first transmission filter 31, but the present preferred embodiment is not limited thereto. The duty of the specific resonator 4A in the first reception filter 32 may be larger than the duty of the specific resonator 4A in the first transmission filter 31. In this case, a level of IMD3 of the first reception filter 32 can be increased by increasing the duty of the specific resonator 4A in the first reception filter 32. Thus, it is easy to reduce a difference between a level of IMD3 of the first reception filter 32 and a level of IMD3 of the first transmission filter 31, and it is easy to achieve a cancellation effect between IMD3 and IMD3.

Preferred Embodiment 2

A circuit configuration of the multiplexer 1 according to Preferred Embodiment 2 is the same as the circuit configuration of the multiplexer 1 (see FIGS. 1 and 6) according to Preferred Embodiment 1, so that illustration and description thereof will be omitted. Hereinafter, the multiplexer 1 according to Preferred Embodiment 2 will be described with reference to FIGS. 18A and 18B.

In the multiplexer 1 according to Preferred Embodiment 2, a thickness H1 (refer to FIG. 18A) of the IDT electrode 50 of the specific resonator 4A (parallel arm resonator P14) in the first transmission filter 31 is smaller than a thickness H2 (refer to FIG. 18B) of the IDT electrode 50 of the specific resonator 4A (series arm resonator S44) in the first reception filter 32. Thus, in the multiplexer 1 according to Preferred Embodiment 2, even when the capacitance of the damping capacitance C0 of the specific resonator 4A (parallel arm resonator P14) in the first transmission filter 31 is made equal to the capacitance of the damping capacitance C0 of the specific resonator 4A (series arm resonator S44) in the first reception filter 32, it is possible to reduce the level of IMD3 in the first transmission filter 31. Thus, in the multiplexer 1 according to Preferred Embodiment 2, since the level of IMD3 in the first transmission filter 31 can be made close to the level of IMD3 in the first reception filter 32, the level of IMD3 can be made small.

Preferred Embodiment 3

A circuit configuration of the multiplexer 1 according to Preferred Embodiment 3 is the same as the circuit configuration of the multiplexer 1 (see FIGS. 1 and 6) according to Preferred Embodiment 1, so that illustration and description thereof will be omitted. Hereinafter, the multiplexer 1 according to Preferred Embodiment 3 will be described with reference to FIGS. 19A to 19C.

In the multiplexer 1 according to Preferred Embodiment 3, the IDT electrode 50 (see FIG. 19A) of the specific resonator 4A (parallel arm resonator P14) in the first transmission filter includes a polycrystalline metal electrode, and the IDT electrode 50 (see FIG. 19C) of the specific resonator 4A (series arm resonator S44) in the first reception filter 32 includes an epitaxial layer made of metal.

Figure 19A:
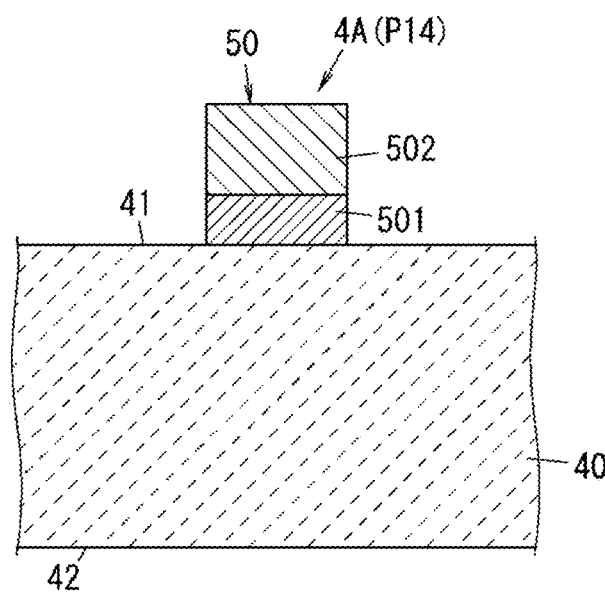
FIG. 19A is a cross-sectional view of a specific resonator of a first transmission filter in a multiplexer according to Preferred Embodiment 3 of the present invention.
Figure 19B:
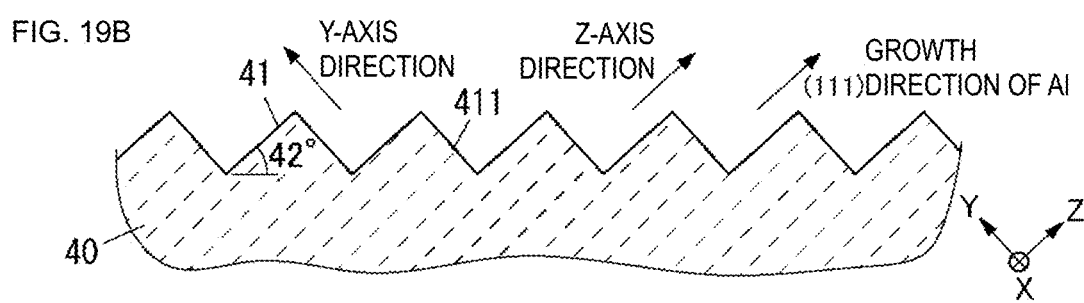
FIG. 19B is an explanatory diagram of a method of forming a specific resonator of a first reception filter in the multiplexer described above.
Figure 19C:
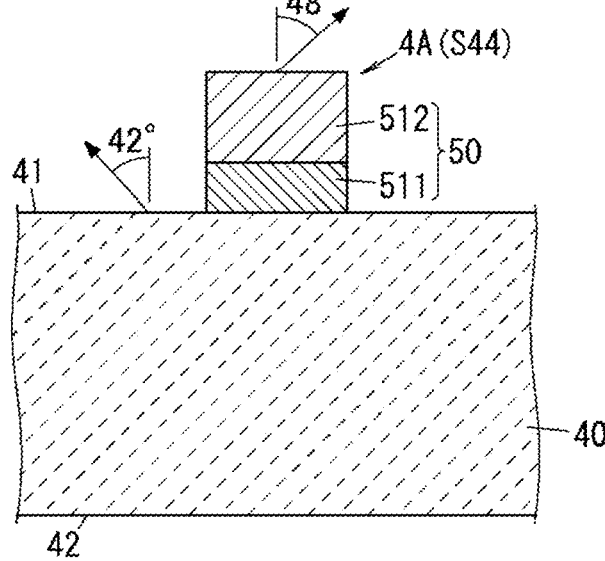
FIG. 19C is a cross-sectional view of the specific resonator of the first reception filter in the multiplexer described above.

For example, as illustrated in FIG. 19A, the IDT electrode 50 of the parallel arm resonator P14 includes an adhesion layer 501 including a first polycrystalline layer on the first principal surface 41 of the piezoelectric substrate 40, and a main electrode layer 502 including a second polycrystalline layer on the adhesion layer 501. The first polycrystalline layer is, for example, a polycrystalline Ti layer. The second polycrystalline layer is, for example, a polycrystalline Al layer. For example, as illustrated in FIG. 19C, the IDT electrode 50 of the series arm resonator S44 includes an adhesion layer 511 including a first epitaxial layer on the first principal surface 41 of the piezoelectric substrate 40, and a main electrode layer 512 including a second epitaxial layer on the adhesion layer 511. The first epitaxial layer is, for example, a Ti epitaxial layer. The second epitaxial layer is, for example, an Al epitaxial layer. The piezoelectric substrate 40 is a piezoelectric substrate polarized along the Z-axis. The first principal surface 41 of the piezoelectric substrate 40 before growing the Ti epitaxial layer and the Al epitaxial layer has an uneven structure (step-like structure) including a Z surface 411 orthogonal to the Z-axis direction, as illustrated in FIG. 19B. The X-axis, the Y-axis, and the Z-axis are illustrated at the right side of the piezoelectric substrate 40 in FIG. 19B. The adhesion layer 511 including the Ti epitaxial layer is, for example, an epitaxial growth layer that is epitaxially grown in the Z-axis direction on the Z surface 411 of the piezoelectric substrate 40 such that a Ti (001) surface that is a crystal growth surface is parallel to the Z surface 411 of the piezoelectric substrate 40. The main electrode layer 512 including the Al epitaxial layer is an epitaxial growth layer that is epitaxially grown in the Z-axis direction on a surface of the adhesion layer 511 such that an Al (111) surface that is a crystal growth surface is parallel to the Z surface 411 and the Ti (001) surface of the piezoelectric substrate 40. Due to this, in the IDT electrode 50 of the series arm resonator S44, the main electrode layer 512 including the Al epitaxial layer having a crystal orientation oriented in the Z-axis direction of the piezoelectric substrate 40 is formed on the piezoelectric substrate 40. Thus, the IDT electrode 50 of the series arm resonator S44 is an electrode formed on the piezoelectric substrate 40 such that the Al (111) surface is parallel to a crystal surface of the piezoelectric substrate 40. In other words, in the IDT electrode 50 of the series arm resonator S44, a [111] direction orthogonal to the Al (111) surface of the main electrode layer 512 is parallel to the Z-axis (c-axis) of the piezoelectric substrate 40. On the other hand, the main electrode layer 502 including the polycrystalline Al layer is, for example, a polycrystalline Al layer that does not satisfy conditions of the Al epitaxial layer of the main electrode layer 512. Here, for the main electrode layer 502 including the polycrystalline Al layer, for example, any one of a c-axis, an a-axis, and a b-axis is randomly oriented.

In the multiplexer 1 according to Preferred Embodiment 3, the IDT electrode 50 (see FIG. 19A) of the parallel arm resonator P14 includes a polycrystalline metal electrode, and the IDT electrode 50 (see FIG. 19C) of the series arm resonator S44 includes an epitaxial layer made of metal. This makes it possible to reduce the difference between the level of IMD3 of the first transmission filter 31 and the level of IMD3 of the first reception filter 32 even when the capacitance of the damping capacitance C0 of the specific resonator 4A (parallel arm resonator P14) in the first transmission filter 31 is made equal to the capacitance of the damping capacitance C0 of the specific resonator 4A (series arm resonator S44) in the first reception filter 32. Thus, in the multiplexer 1 according to Preferred Embodiment 3, the level of IMD3 can be reduced.

Preferred Embodiment 4

A circuit configuration of the multiplexer 1 according to Preferred Embodiment 4 is the same as the circuit configuration of the multiplexer 1 (see FIGS. 1 and 6) according to Preferred Embodiment 1, so that illustration and description thereof will be omitted. Hereinafter, the multiplexer 1 according to Preferred Embodiment 4 will be described with reference to FIGS. 20A and 20B.

In the multiplexer 1 according to Preferred Embodiment 4, the IDT electrode 50 (see FIG. 20A) of the specific resonator 4A (parallel arm resonator P14) in the first transmission filter 31 includes one or more materials selected from Pt, Mo, Au, Ag, Cu, and W. The content rate of the one or more materials selected from Pt, Mo, Au, Ag, Cu, and W in the IDT electrode 50 of the specific resonator (parallel arm resonator P14) in the first transmission filter 31 is higher than the content rate of the one or more materials described above in the IDT electrode 50 of the specific resonator 4A (series arm resonator S44) in the first reception filter 32. Pt, Mo, Au, Ag, Cu, and W are materials having a larger Young's modulus than Al, and in the multiplexer 1 according to Preferred Embodiment 4, it is possible to reduce distortion generated by the IDT electrode 50.

For example, the IDT electrode 50 of the specific resonator 4A (parallel arm resonator P14) in the first transmission filter 31 includes, for example, a Ti layer on the first principal surface 41 of the piezoelectric substrate 40 and an AlCu layer on the Ti layer. Additionally, the IDT electrode 50 of the specific resonator 4A (series arm resonator S44) of the first reception filter 32 includes a Ti layer on the first principal surface 41 of the piezoelectric substrate 40 and an Al layer on the Ti layer. Note that when an AlCu layer is used instead of the Al layer of the IDT electrode 50 of the first reception filter 32, the Cu content rate of the AlCu layer in the IDT electrode 50 of the first transmission filter 31 can be set higher than the Cu content rate of the AlCu layer in the IDT electrode 50 of the first reception filter 32. In addition, each IDT electrode 50 may include, for example, a Cr layer instead of the Ti layer.

In the multiplexer 1 according to Preferred Embodiment 4, as described above, the content rate of the one or more materials selected from Pt, Mo, Au, Ag, Cu, and W in the IDT electrode 50 of the specific resonator (parallel arm resonator P14) of the first transmission filter 31 is higher than the content rate of the one or more materials described above in the IDT electrode 50 of the specific resonator 4A (series arm resonator S44) of the first reception filter 32. Thus, in the multiplexer 1 according to Preferred Embodiment 4, it is possible to further suppress the occurrence of IMD.

Preferred Embodiment 5

Hereinafter, a multiplexer 1a according to Preferred Embodiment 5 will be described with reference to FIG. 21. In the multiplexer 1a according to Preferred Embodiment 5, similar elements to those of the multiplexer 1 according to Preferred Embodiment 1 are denoted by the same reference signs, and description thereof will be omitted.

The multiplexer 1a according to Preferred Embodiment 5 includes a first reception filter 32a and a second reception filter 34a instead of the first reception filter 32 and the second reception filter 34 in the multiplexer 1 according to Preferred Embodiment 1.

The first reception filter 32a is different from the first reception filter 32 in that a parallel circuit of a longitudinally coupled resonator 402 and a longitudinally coupled resonator 403 is provided between the series arm resonator S44 and the parallel arm resonator P41 that are the specific resonators 4A. Additionally, the second reception filter 34a is different from the second reception filter 34 in that a longitudinally coupled resonator 404 is provided between the series arm resonator S23 and the parallel arm resonator P21.

Similarly to the multiplexer 1 according to Preferred Embodiment 1, the multiplexer 1a according to Preferred Embodiment satisfies a first condition or a second condition, under conditions that a phase of an acoustic path current Iac at the common terminal 2 side of the first transmission filter 31 at a frequency within the first transmission band is denoted by $\theta 1_{Tx}$, a phase of an acoustic path current Iac at the common terminal 2 side of the first transmission filter 31 at a frequency within the second transmission band is denoted by $\theta 2_{Tx}$, a phase of an acoustic path current Iac at the common terminal 2 side of the first reception filter 32a at a frequency within the first transmission band is denoted by $\theta 1_{Rx}$, and a phase of an acoustic path current Iac at the common terminal 2 side of the first reception filter 32a at a frequency within the second transmission band is denoted by $\theta 2_{Rx}$. The first condition is a condition that $|(2 \cdot \theta 1_{Tx} - \theta 2_{Tx}) - (2 \cdot \theta 1_{Rx} - \theta 2_{Rx})| = 180° \pm 90°$. The second condition is a condition that $|(2 \cdot \theta 2_{Tx} - \theta 1_{Tx}) - (2 \cdot \theta 2_{Rx} - \theta 1_{Rx})| = 180° \pm 90°$.

In the multiplexer 1a according to Preferred Embodiment 5, it is possible to suppress the occurrence of IMD, similarly to the multiplexer 1 according to Preferred Embodiment 1.

Each of Preferred Embodiment 1 and Modifications 1 to 3 thereof, and Preferred Embodiments 2 to 5 that have been described above is merely one of various preferred embodiments of the present invention. The above-described Preferred Embodiments 1 to 5 and the like can be variously modified according to design and the like, and can be appropriately combined.

Further, the combination of two-uplink carrier aggregation that the multiplexers 1 and 1a can support is not limited to the combination of the transmission band in Band1 and the transmission band in Band3, and for example, combinations of Band5 and Band7, Band5 and Band3, Band4 and Band7, and the like can be supported.

For example, in the multiplexers 1 and 1a, the plurality of phase shift circuits 8 are not essential elements, and at least one of the plurality of filters 3 may be connected to the common terminal 2 without the phase shift circuit 8 interposed therebetween.

Additionally, each of the multiplexers 1 and 1a includes the plurality of filters 3, but may be only required to include at least the first transmission filter 31, the first reception filter 32, and the second transmission filter 33. Additionally, the number of the plurality of filters 3 is not limited to three or four, and may be five or more.

Additionally, in the multiplexers 1 and 1a, each of the plurality of filters 3 is an acoustic wave filter using a surface acoustic wave, but is not limited thereto, and may be an acoustic wave filter using a boundary acoustic wave, a plate wave, or the like, for example.

In the acoustic wave filter, each of a plurality of series arm resonators and a plurality of parallel arm resonators is not limited to a SAW resonator, and may be, for example, a bulk acoustic wave (BAW) resonator.

Aspects

The following aspects are disclosed herein.

A multiplexer (1; 1a) according to a first aspect includes a common terminal (2) and a plurality of filters (3). The plurality of filters (3) are connected to the common terminal (2). Each of the plurality of filters (3) includes a plurality of resonators (4). The plurality of filters (3) include a first transmission filter (31), a second transmission filter (33), and a first reception filter (32; 32a). The first transmission filter (31) has a pass band including a first transmission band. The second transmission filter (33) has a pass band including a second transmission band different from the first transmission band. The first reception filter (32; 32a) has a pass band including a first reception band. A center frequency of the first reception band is between a center frequency of the first transmission band and a center frequency of the second transmission band. In the multiplexer (1; 1a), in a case where an electric equivalent circuit of a specific resonator (4A) among the plurality of resonators 4 in each of the plurality of filters 3 is represented by using a parallel circuit including a series circuit of an equivalent resistance ($R_m$), an equivalent inductor ($L_m$), and an equivalent capacitance ($C_m$) and a damping capacitance (C0), and a current flowing through the damping capacitance (C0) is represented by an acoustic path current (Iac), under conditions that a phase of an acoustic path current (Iac) of the first transmission filter (31) at a side of the common terminal (2) at a frequency within the first transmission band is represented as $\theta 1_{Tx}$, a phase of an acoustic path current (Iac) of the first transmission filter (31) at the side of the common terminal (2) at a frequency within the second transmission band is represented as $\theta 2_{Tx}$, a phase of an acoustic path current (Iac) of the first reception filter (32, 32a) at the side of the common terminal (2) at a frequency within the first transmission band is represented as $\theta 1_{Rx}$, and a phase of an acoustic path current (Iac) of the first reception filter (32, 32a) at the side of the common terminal (2) at a frequency within the second transmission band is represented as $\theta 2_{Rx}$, the multiplexer (1; 1a) satisfies a first condition or a second condition. The first condition is a condition that $|(2 \cdot \theta 1_{Tx} - \theta 2_{Tx}) - (2 \cdot \theta 1_{Rx} - \theta 2_{Rx})| = 180° \pm 90°$. The second condition is a condition that $|(2 \cdot \theta 2_{Tx} - \theta 1_{Tx}) - (2 \cdot \theta 2_{Rx} - \theta 1_{Rx})| = 180° \pm 90°$.

The multiplexer (1; 1a) according to the first aspect can suppress the occurrence of IMD.

In a multiplexer (1; 1a) according to a second aspect, in the first aspect, the plurality of filters (3) further include a second reception filter (34; 34a). The second reception filter (34; 34a) has a pass band including a second reception band different from the first reception band. The second reception band includes a frequency obtained by subtracting a frequency within the second transmission band from a frequency twice a frequency within the first transmission band, or a frequency obtained by subtracting a frequency within the first transmission band from a frequency twice a frequency within the second transmission band.

The multiplexer (1; 1a) according to the second aspect can suppress IMD generated in the second reception band, and can suppress deterioration in reception sensitivity of the second reception filter (34; 34a).

In a multiplexer (1; 1a) according to a third aspect, in the second aspect, in a case where in relation to the first transmission filter (31), a density of an acoustic path current of the first transmission filter (31) at a side of the common terminal (2) at a frequency within the first transmission band is represented by $I1_{TX1}$, a density of an acoustic path current of the first transmission filter (31) at the side of the common terminal (2) at a frequency within the second transmission band is represented by $I2_{TX1}$, and a capacitance of the damping capacitance (C0) of the specific resonator (4A) in the first transmission filter (31) is represented by $C0_{TX1}$, in relation to the second transmission filter (33), a density of an acoustic path current of the second transmission filter (33) at the side of the common terminal (2) at a frequency within the first transmission band is represented by $I1_{TX2}$, a density of an acoustic path current of the second transmission filter (33) at the side of the common terminal (2) at a frequency within the second transmission band is represented by $I2_{TX2}$, and a capacitance of the damping capacitance (C0) of the specific resonator (4A) in the second transmission filter (33) is represented by $C0_{TX2}$, in relation to the first reception filter (32, 32a), a density of an acoustic path current of the first reception filter (32, 32a) at the side of the common terminal (2) at a frequency within the first transmission band is represented by $I1_{RX1}$, a density of an acoustic path current of the first reception filter (32, 32a) at the side of the common terminal (2) at a frequency within the second transmission band is represented by $I2_{RX1}$, and a capacitance of the damping capacitance (C0) of the specific resonator (4A) in the first reception filter (32, 32a) is represented by $C0_{RX1}$, and in relation to the second reception filter (34, 34a), a density of an acoustic path current of the second reception filter (34, 34a) at the side of the common terminal (2) at a frequency within the first transmission band is represented by $I1_{RX2}$, a density of an acoustic path current of the second reception filter (34, 34a) at the side of the common terminal (2) at a frequency within the second transmission band is represented by $I2_{RX2}$, and a capacitance of the damping capacitance (C0) of the specific resonator (4A) in the second reception filter (34, 34a) is represented by $C0_{RX2}$, the multiplexer (1; 1a) satisfies a third condition, a fourth condition, a fifth condition, and a sixth condition.

The third condition is as follows.

$$(I1_{Tx1})^2 \cdot (I2_{Tx1}) \cdot C0_{Tx1} > (I1_{Tx2})^2 \cdot (I2_{Tx2}) \cdot C0_{Tx2}$$

The fourth condition is as follows.

$$(I1_{Tx1})^2 \cdot (I2_{Tx1}) \cdot C0_{Tx1} > (I1_{Rx2})^2 \cdot (I2_{Rx2}) \cdot C0_{Rx2}$$

The fifth condition is as follows.

$$(I1_{Rx1})^2 \cdot (I2_{Rx1}) \cdot C0_{Rx1} > (I1_{Tx2})^2 \cdot (I2_{Tx2}) \cdot C0_{Tx2}$$

The sixth condition is as follows.

$$(I1_{Rx1})^2 \cdot (I2_{Rx1}) \cdot C0_{Rx1} > (I1_{Rx2})^2 \cdot (I2_{Rx2}) \cdot C0_{Rx2}$$

The multiplexer (1; 1a) according to the third aspect can suppress the occurrence of IMD.

In a multiplexer (1; 1a) according to a fourth aspect, in the third aspect, the specific resonator (4A) among the plurality of resonators (4) in each of the plurality of filters (3) is a resonator closest to the common terminal (2). The $I1_{Tx1}$ is a density of an acoustic path current flowing in the specific resonator (4A) of the first transmission filter (31) at a frequency within the first transmission band. The $I2_{Tx1}$ a density of an acoustic path current flowing in the specific resonator (4A) of the first transmission filter (31) at a frequency within the second transmission band. The $I1_{Rx1}$ is a density of an acoustic path current flowing in the specific resonator (4A) of the first reception filter (32; 32a) at a frequency within the first transmission band. The $I2_{Rx1}$ is a density of an acoustic path current flowing in the specific resonator (4A) of the first reception filter (32; 32a) at a frequency within the second transmission band. In the multiplexer (1; 1a), $(I1_{Tx1})^2 \cdot (I2_{Tx1}) \cdot C0_{Tx1}$ is a value within ±75% of $(I1_{Rx2})^2 \cdot (I2_{Rx1}) \cdot C0_{Rx1}$, or $(I1_{Rx2})^2 \cdot (I2_{Rx1}) \cdot C0_{Rx1}$ is a value within ±75% of $(I1_{Tx1})^2 \cdot (I2_{Tx1}) \cdot C0_{Tx1}$.

The multiplexer (1; 1a) according to the fourth aspect can further suppress the occurrence of IMD.

In a multiplexer (1; 1a) according to a fifth aspect, in the fourth aspect, the capacitance of the damping capacitance (C0) of the specific resonator (4A) in the first transmission filter (31) is larger than the capacitance of the damping capacitance (C0) of the specific resonator (4A) in the first reception filter (32; 32a).

The multiplexer (1; 1a) according to the fifth aspect can further suppress the occurrence of IMD.

In a multiplexer (1; 1a) according to a sixth aspect, in the fifth aspect, an area of the specific resonator (4A) of the first transmission filter (31) is larger than an area of the specific resonator (4A) of the first reception filter (32; 32a).

The multiplexer (1; 1a) according to the sixth aspect can further suppress the occurrence of IMD.

In a multiplexer (1; 1a) according to a seventh aspect, in the sixth aspect, the specific resonator (4A) of the first transmission filter (31) includes a plurality of division resonators (401) connected in series. The specific resonator (4A) of the first reception filter (32; 32a) includes a plurality of division resonators (401) connected in series. The number of the division resonators (401) included in the specific resonator (4A) of the first transmission filter (31) is larger than the number of the division resonators (401) included in the specific resonator (4A) of the first reception filter (32; 32a).

The multiplexer (1; 1a) according to the seventh aspect can further suppress the occurrence of IMD.

A multiplexer (1; 1a) according to an eighth aspect is based on any one of the first to fourth aspects. In the multiplexer (1; 1a), in each of the plurality of filters (3), the specific resonator (4A) among the plurality of resonators (4) is the resonator (4) closest to the common terminal (2). Each of the first transmission filter (31), the second transmission filter (33), and the first reception filter (32) is a ladder filter, and includes, as the plurality of resonators (4), a plurality of series arm resonators (S11 to S14, S31 to S34, and S41 to S44) and a plurality of parallel arm resonators (P11 to P14, P31 to P34, and P41 to P44). Regarding one (the first transmission filter 31) of the first transmission filter (31) and the second transmission filter (33) and the first reception filter (32), in a filter (the first transmission filter 31) having a center frequency of a relatively high pass band, the specific resonator (4A) is one parallel arm resonator (P14) among the plurality of parallel arm resonators (P11 to P14), and in a filter (the first reception filter 32) having a center frequency of a relatively low pass band, the specific resonator (4A) is one series arm resonator (S44) among the plurality of series arm resonators (S41 to S44). In the multiplexer (1; 1a), a capacitance of the damping capacitance (C0) of the specific resonator (4A) of one of the first transmission filter (31) and the second transmission filter (33) is larger than a capacitance of the damping capacitance (C0) of the specific resonator (4A) of the first reception filter (32; 32a). Alternatively, in the multiplexer (1; 1a), an area of the specific resonator (4A) of one of the first transmission filter (31) and the second transmission filter (33) is larger than an area of the specific resonator (4A) of the first reception filter (32). Alternatively, in the multiplexer (1; 1a), the number of a plurality of division resonators (401) included in the specific resonator (4A) of one of the first transmission filter (31) and the second transmission filter (33), the plurality of division resonators (401) being connected in series, is larger than the number of a plurality of division resonators (401) included in the specific resonator (4A) of the first reception filter (32), the plurality of division resonators (401) being connected in series. Alternatively, in the multiplexer (1; 1a), each of the plurality of resonators (4) of the first transmission filter (31) includes an IDT electrode (50), each of the plurality of resonators (4) of the first reception filter (32) includes an IDT electrode (50), and a duty of the IDT electrode (50) of the specific resonator (4A) of the first transmission filter (31) is different from a duty of the IDT electrode (50) of the specific resonator (4A) of the first reception filter (32). Alternatively, in the multiplexer (1; 1a), each of the plurality of resonators (4) of the first transmission filter (31) includes an IDT electrode (50), each of the plurality of resonators (4) of the first reception filter (32) includes an IDT electrode (50), and a thickness (H1) of the IDT electrode (50) in the specific resonator (4A) of the first transmission filter (31) is smaller than a thickness (H2) of the IDT electrode (50) in the specific resonator (4A) of the first reception filter (32). Alternatively, in the multiplexer (1; 1a), each of the plurality of resonators (4) of the first transmission filter (31) includes an IDT electrode (50), each of the plurality of resonators (4) of the first reception filter (32) includes an IDT electrode (50), the IDT electrode (50) of the specific resonator (4A) of the first transmission filter (31) is a polycrystalline metal electrode, and the IDT electrode (50) of the specific resonator (4A) of the first reception filter (32) is an epitaxial layer electrode made of metal. Alternatively, in the multiplexer (1; 1a), each of the plurality of resonators (4) of the first transmission filter (31) includes an IDT electrode (50), each of the resonators (4) of the first reception filter (32) includes an IDT electrode (50), the IDT electrode (50) of the specific resonator (4A) of the first transmission filter (31) includes one or more materials selected from Pt, Mo, Au, Ag, Cu, and W, and a content rate of the one or more materials selected from Pt, Mo, Au, Ag, Cu, and W in the IDT electrode (50) of the specific resonator (4A) of the first transmission filter (31) is higher than a content rate of the one or more materials in the IDT electrode (50) of the specific resonator (4A) of the first reception filter (32).

The multiplexer (1; 1a) according to the eighth aspect can further suppress the occurrence of IMD.

A multiplexer (1) according to a ninth aspect includes a common terminal (2) and a plurality of filters (3). The plurality of filters (3) are connected to the common terminal (2). Each of the plurality of filters (3) includes a plurality of resonators (4). The plurality of filters (3) include a first transmission filter (31), a second transmission filter (33), and a first reception filter (32). The first transmission filter (31) has a pass band including a first transmission band. The second transmission filter (33) has a pass band including a second transmission band different from the first transmission band. The first reception filter (32) has a pass band including a first reception band. A center frequency of the first reception band is between a center frequency of the first transmission band and a center frequency of the second transmission band. In each of the plurality of filters (3), a resonator closest to the common terminal (2) among the plurality of resonators (4) is defined as a specific resonator (4A). Each of the first transmission filter (31), the second transmission filter (33), and the first reception filter (32) is a ladder filter, and includes, as the plurality of resonators (4), a plurality of series arm resonators (S11 to S14, S31 to S34, and S41 to S44) and a plurality of parallel arm resonators (P11 to P14, P31 to P34, and P41 to P44). Regarding one (the first transmission filter 31) of the first transmission filter (31) and the second transmission filter (33) and the first reception filter (32), in a filter (the first transmission filter 31) having a center frequency of a relatively high pass band, the specific resonator (4A) is one parallel arm resonator (P14) among the plurality of parallel arm resonators (P11 to P14), and in a filter (the first reception filter 32) having a center frequency of a relatively low pass band, the specific resonator (4A) is one series arm resonator (S44) among the plurality of series arm resonators (S41 to S44). In the multiplexer (1), a capacitance of a damping capacitance (C0) of the specific resonator (4A) of one of the first transmission filter (31) and the second transmission filter (33) is larger than a capacitance of a damping capacitance (C0) of the specific resonator (4A) of the first reception filter (32). Alternatively, in the multiplexer (1), an area of the specific resonator (4A) of one of the first transmission filter (31) and the second transmission filter (33) is larger than an area of the specific resonator (4A) of the first reception filter (32). Alternatively, in the multiplexer (1), the number of a plurality of division resonators (401) included in the specific resonator (4A) of one of the first transmission filter (31) and the second transmission filter (33), the plurality of division resonators (401) being connected in series, is larger than the number of a plurality of division resonators (401) included in the specific resonator (4A) of the first reception filter (32), the plurality of division resonators (401) being connected in series. Alternatively, in the multiplexer (1), each of the plurality of resonators (4) of the first transmission filter (31) includes an IDT electrode (50), each of the plurality of resonators (4) of the first reception filter (32) includes an IDT electrode (50), and a duty of the IDT electrode (50) of the specific resonator (4A) of the first transmission filter (31) is different from a duty of the IDT electrode (50) of the specific resonator (4A) of the first reception filter (32). Alternatively, in the multiplexer (1), each of the plurality of resonators (4) of the first transmission filter (31) includes an IDT electrode (50), each of the plurality of resonators (4) of the first reception filter (32) includes an IDT electrode (50), and a thickness of the IDT electrode (50) in the specific resonator (4A) of the first transmission filter (31) is smaller than a thickness of the IDT electrode (50) in the specific resonator (4A) of the first reception filter (32). Alternatively, in the multiplexer (1), each of the plurality of resonators (4) of the first transmission filter (31) includes an IDT electrode (50), each of the plurality of resonators (4) of the first reception filter (32) includes an IDT electrode (50), the IDT electrode (50) of the specific resonator (4A) of the first transmission filter (31) is a polycrystalline metal electrode, and the IDT electrode (50) of the specific resonator (4A) of the first reception filter (32) is an epitaxial layer electrode made of metal. Alternatively, in the multiplexer (1), each of the plurality of resonators (4) of the first transmission filter (31) includes an IDT electrode (50), each of the plurality of resonators (4) of the first reception filter (32) includes an IDT electrode (50), the IDT electrode (50) of the specific resonator (4A) of the first transmission filter (31) includes one or more materials selected from Pt, Mo, Au, Ag, Cu, and W, and a content rate of the one or more materials selected from Pt, Mo, Au, Ag, Cu, and W in the IDT electrode (50) of the specific resonator (4A) of the first transmission filter (31) is higher than a content rate of the one or more materials in the IDT electrode (50) of the specific resonator (4A) of the first reception filter (32).

The multiplexer (1) according to the ninth aspect can suppress the occurrence of IMD.

A multiplexer (1; 1a) according to a tenth aspect further includes, in any one of the first to ninth aspects, a first phase shift circuit (81) and a second phase shift circuit (82). The first phase shift circuit (81) is connected between the common terminal (2) and the first transmission filter (31). The second phase shift circuit (82) is connected between the common terminal (2) and the first reception filter (32). An absolute value of a phase shift amount of the first phase shift circuit (81) is larger than an absolute value of a phase shift amount of the second phase shift circuit (82).

The multiplexer (1; 1a) according to the tenth aspect can further suppress the occurrence of IMD.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer comprising:
a common terminal; and
a plurality of filters connected to the common terminal, each of the plurality of filters including a plurality of resonators; wherein
the plurality of filters include:
a first transmission filter having a pass band including a first transmission band;
a second transmission filter having a pass band including a second transmission band different from the first transmission band; and
a first reception filter having a pass band including a first reception band; wherein
a center frequency of the first reception band is between a center frequency of the first transmission band and a center frequency of the second transmission band;
in a case where an electric equivalent circuit of a specific resonator among the plurality of resonators in each of the plurality of filters is represented by using a parallel circuit including a series circuit of an equivalent resistance, an equivalent inductor, and an equivalent capacitance, and a damping capacitance, and a current flowing in the series circuit is defined as an acoustic path current;
under conditions that a phase of an acoustic path current of the first transmission filter at a side of the common terminal at a frequency within the first transmission band is represented as $\theta 1_{Tx}$, a phase of an acoustic path current of the first transmission filter at the side of the common terminal at a frequency within the second transmission band is represented as $\theta 2_{Tx}$, a phase of an acoustic path current of the first reception filter at the side of the common terminal at a frequency within the first transmission band is represented as $\theta 1_{Rx}$, and a phase of an acoustic path current of the first reception filter at the side of the common terminal at a frequency within the second transmission band is represented as $\theta 2_{Rx}$;
the multiplexer satisfies a first condition or a second condition; and
the first condition is a condition that $$|(2 \cdot \theta 1_{Tx} - \theta 2_{Tx}) - (2 \cdot \theta 1_{Rx} - \theta 2_{Rx})| = 180° \pm 90°; \text{ and}$$

the second condition is a condition that $$|(2 \cdot \theta 2_{Tx} - \theta 1_{Tx}) - (2 \cdot \theta 2_{Rx} - \theta 1_{Rx})| = 180° \pm 90°.$$

2. The multiplexer according to claim 1, wherein
the plurality of filters further include a second reception filter having a pass band including a second reception band different from the first reception band; and
the second reception band includes:
a frequency obtained by subtracting a frequency within the second transmission band from a frequency twice a frequency within the first transmission band, or a frequency obtained by subtracting a frequency within the first transmission band from a frequency twice a frequency within the second transmission band.

3. The multiplexer according to claim 2, wherein in a case where in relation to the first transmission filter:
a density of an acoustic path current of the first transmission filter at the side of the common terminal at a frequency within the first transmission band is represented by $I1_{TX1}$;
a density of an acoustic path current of the first transmission filter at the side of the common terminal at a frequency within the second transmission band is represented by $I2_{TX1}$; and
a capacitance of the damping capacitance of the specific resonator in the first transmission filter is represented by $C0_{TX1}$;
in relation to the second transmission filter:
a density of an acoustic path current of the second transmission filter at the side of the common terminal at a frequency within the first transmission band is represented by $I1_{TX2}$;
a density of an acoustic path current of the second transmission filter at the side of the common terminal at a frequency within the second transmission band is represented by $I2_{TX2}$; and
a capacitance of the damping capacitance of the specific resonator in the second transmission filter is represented by $C0_{TX2}$;
in relation to the first reception filter:
a density of an acoustic path current of the first reception filter at the side of the common terminal at a frequency within the first transmission band is represented by $I1_{RX1}$;

a density of an acoustic path current of the first reception filter at the side of the common terminal at a frequency within the second transmission band is represented by $I2_{RX1}$; and a capacitance of the damping capacitance of the specific resonator in the first reception filter is represented by $C0_{RX1}$;

in relation to the second reception filter:

a density of an acoustic path current of the second reception filter at the side of the common terminal at a frequency within the first transmission band is represented by $I1_{RX2}$;

a density of an acoustic path current of the second reception filter at the side of the common terminal at a frequency within the second transmission band is represented by $I2_{RX2}$; and a capacitance of the damping capacitance of the specific resonator in the second reception filter is represented by $C0_{RX2}$;

the multiplexer satisfies a third condition, a fourth condition, a fifth condition, and a sixth condition:

the third condition is a condition that $$(I1_{Tx1})^2 \cdot (I2_{Tx1}) \cdot C0_{Tx1} > (I1_{Tx2})^2 \cdot (I2_{Tx2}) \cdot C0_{Tx2}$$

the fourth condition is a condition that $$(I1_{Tx1})^2 \cdot (I2_{Tx1}) \cdot C0_{Tx1} > (I1_{Rx2})^2 \cdot (I2_{Rx2}) \cdot C0_{Rx2}$$

the fifth condition is a condition that $$(I1_{Rx1})^2 \cdot (I2_{Rx1}) \cdot C0_{Rx1} > (I1_{Tx2})^2 \cdot (I2_{Tx2}) \cdot C0_{Tx2}$$

the sixth condition is a condition that $$(I1_{Rx1})^2 \cdot (I2_{Rx1}) \cdot C0_{Rx1} > (I1_{Rx2})^2 \cdot (I2_{Rx2}) \cdot C0_{Rx2}.$$

4. The multiplexer according to claim 3, wherein the specific resonator among the plurality of resonators in each of the plurality of filters is a resonator closest to the common terminal;

the $I1_{Tx1}$ is a density of an acoustic path current flowing in the specific resonator of the first transmission filter at a frequency within the first transmission band;

the $I2_{Tx1}$ is a density of an acoustic path current flowing in the specific resonator of the first transmission filter at a frequency within the second transmission band;

the $I1_{Rx1}$ is a density of an acoustic path current flowing in the specific resonator of the first reception filter at a frequency within the first transmission band;

the $I2_{Rx1}$ is a density of an acoustic path current flowing in the specific resonator of the first reception filter at a frequency within the second transmission band; and $(I1_{Tx1})^2 \cdot (I2_{Tx1}) \cdot C0_{Tx1}$ is a value within ±75% of $(I1_{Rx2})^2 \cdot (I2_{Rx1}) \cdot C0_{Rx1}$; Or $(I1_{Rx2})^2 \cdot (I2_{Rx1}) \cdot C0_{Rx1}$ is a value within ±75% of $(I1_{Tx1})^2 \cdot (I2_{Tx1}) \cdot C0_{Tx1}$.

5. The multiplexer according to claim 4, wherein the capacitance of the damping capacitance of the specific resonator in the first transmission filter is larger than the capacitance of the damping capacitance of the specific resonator in the first reception filter.

6. The multiplexer according to claim 5, wherein an area of the specific resonator of the first transmission filter is larger than an area of the specific resonator of the first reception filter.

7. The multiplexer according to claim 6, wherein the specific resonator of the first transmission filter includes a plurality of division resonators connected in series;

the specific resonator of the first reception filter includes a plurality of division resonators connected in series; and a number of the plurality of division resonators included in the specific resonator of the first transmission filter is larger than a number of the plurality of division resonators included in the specific resonator of the first reception filter.

8. The multiplexer according to claim 7, further comprising:

a first phase shift circuit connected between the common terminal and the first transmission filter; and a second phase shift circuit connected between the common terminal and the first reception filter; wherein an absolute value of a phase shift amount of the first phase shift circuit is larger than an absolute value of a phase shift amount of the second phase shift circuit.

9. The multiplexer according to claim 6, further comprising:

a first phase shift circuit connected between the common terminal and the first transmission filter; and a second phase shift circuit connected between the common terminal and the first reception filter; wherein an absolute value of a phase shift amount of the first phase shift circuit is larger than an absolute value of a phase shift amount of the second phase shift circuit.

10. The multiplexer according to claim 5, further comprising:

a first phase shift circuit connected between the common terminal and the first transmission filter; and a second phase shift circuit connected between the common terminal and the first reception filter; wherein an absolute value of a phase shift amount of the first phase shift circuit is larger than an absolute value of a phase shift amount of the second phase shift circuit.

11. The multiplexer according to claim 4, wherein the specific resonator among the plurality of resonators in each of the plurality of filters is a resonator closest to the common terminal;

each of the first transmission filter, the second transmission filter, and the first reception filter is a ladder filter, and includes a plurality of series arm resonators and a plurality of parallel arm resonators as the plurality of resonators;

regarding one of the first transmission filter and the second transmission filter, and the first reception filter, in a filter having a center frequency of a relatively high pass band, the specific resonator is one parallel arm resonator among the plurality of parallel arm resonators, and in a filter having a center frequency of a relatively low pass band, the specific resonator is one series arm resonator among the plurality of series arm resonators;

each of the plurality of resonators of the first transmission filter includes an IDT electrode, and each of the plurality of resonators of the first reception filter includes an IDT electrode; and a duty of the IDT electrode of the specific resonator of the first transmission filter is different from a duty of the IDT electrode of the specific resonator of the first reception filter.

12. The multiplexer according to claim 4, further comprising:

a first phase shift circuit connected between the common terminal and the first transmission filter; and a second phase shift circuit connected between the common terminal and the first reception filter; wherein an absolute value of a phase shift amount of the first phase shift circuit is larger than an absolute value of a phase shift amount of the second phase shift circuit.

13. The multiplexer according to claim 3, wherein the specific resonator among the plurality of resonators in each of the plurality of filters is a resonator closest to the common terminal;

each of the first transmission filter, the second transmission filter, and the first reception filter is a ladder filter, and includes a plurality of series arm resonators and a plurality of parallel arm resonators as the plurality of resonators;

regarding one of the first transmission filter and the second transmission filter, and the first reception filter, in a filter having a center frequency of a relatively high pass band, the specific resonator is one parallel arm resonator among the plurality of parallel arm resonators, and in a filter having a center frequency of a relatively low pass band, the specific resonator is one series arm resonator among the plurality of series arm resonators; and a number of a plurality of division resonators included in the specific resonator of one of the first transmission filter and the second transmission filter, the plurality of division resonators being connected in series, is larger than a number of a plurality of division resonators included in the specific resonator of the first reception filter, the plurality of division resonators being connected in series.

14. The multiplexer according to claim 3, further comprising:

a first phase shift circuit connected between the common terminal and the first transmission filter; and a second phase shift circuit connected between the common terminal and the first reception filter; wherein an absolute value of a phase shift amount of the first phase shift circuit is larger than an absolute value of a phase shift amount of the second phase shift circuit.

15. The multiplexer according to claim 2, wherein the specific resonator among the plurality of resonators in each of the plurality of filters is a resonator closest to the common terminal;

each of the first transmission filter, the second transmission filter, and the first reception filter is a ladder filter, and includes a plurality of series arm resonators and a plurality of parallel arm resonators as the plurality of resonators;

regarding one of the first transmission filter and the second transmission filter, and the first reception filter, in a filter having a center frequency of a relatively high pass band, the specific resonator is one parallel arm resonator among the plurality of parallel arm resonators, and in a filter having a center frequency of a relatively low pass band, the specific resonator is one series arm resonator among the plurality of series arm resonators; and an area of the specific resonator of one of the first transmission filter and the second transmission filter is larger than an area of the specific resonator of the first reception filter.

16. The multiplexer according to claim 2, further comprising:

a first phase shift circuit connected between the common terminal and the first transmission filter; and a second phase shift circuit connected between the common terminal and the first reception filter; wherein an absolute value of a phase shift amount of the first phase shift circuit is larger than an absolute value of a phase shift amount of the second phase shift circuit.

17. The multiplexer according to claim 1, wherein the specific resonator among the plurality of resonators in each of the plurality of filters is a resonator closest to the common terminal;

each of the first transmission filter, the second transmission filter, and the first reception filter is a ladder filter, and includes a plurality of series arm resonators and a plurality of parallel arm resonators as the plurality of resonators;

regarding one of the first transmission filter and the second transmission filter, and the first reception filter, in a filter having a center frequency of a relatively high pass band, the specific resonator is one parallel arm resonator among the plurality of parallel arm resonators, and in a filter having a center frequency of a relatively low pass band, the specific resonator is one series arm resonator among the plurality of series arm resonators; and a capacitance of the damping capacitance of the specific resonator of one of the first transmission filter and the second transmission filter is larger than a capacitance of the damping capacitance of the specific resonator of the first reception filter.

18. The multiplexer according to claim 1, further comprising:

a first phase shift circuit connected between the common terminal and the first transmission filter; and a second phase shift circuit connected between the common terminal and the first reception filter; wherein an absolute value of a phase shift amount of the first phase shift circuit is larger than an absolute value of a phase shift amount of the second phase shift circuit.

* * * * *